US009792176B2

(12) United States Patent
Blaichman et al.

(10) Patent No.: US 9,792,176 B2
(45) Date of Patent: Oct. 17, 2017

(54) METHOD AND APPARATUS FOR ENCODING AND DECODING DATA IN MEMORY SYSTEM

(71) Applicant: Samsung Electronics Co., Ltd., Suwon-si, Gyeonggi-do (KR)

(72) Inventors: Evgeny Blaichman, Ramat Gan (IL); Moshe Twitto, Ramat Gan (IL); Avner Dor, Ramat Gan (IL); Elona Erez, Ramat Gan (IL); Jun Jin Kong, Yongin-si (KR); Shay Landis, Ramat Gan (IL); Yaron Shany, Ramat Gan (IL); Yoav Shereshevski, Ramat Gan (IL)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 131 days.

(21) Appl. No.: 14/941,051

(22) Filed: Nov. 13, 2015

(65) Prior Publication Data
US 2017/0139769 A1    May 18, 2017

(51) Int. Cl.
*G06F 11/10* (2006.01)
*G06F 3/06* (2006.01)
(Continued)

(52) U.S. Cl.
CPC .......... *G06F 11/1068* (2013.01); *G06F 3/064* (2013.01); *G06F 3/0619* (2013.01);
(Continued)

(58) Field of Classification Search
CPC .. G06F 11/1068; G06F 3/0619; G06F 3/0653; G06F 3/064; G06F 3/0679; H03M 13/1515; H03M 13/152; G11C 29/52
(Continued)

(56) References Cited

U.S. PATENT DOCUMENTS 7,444,579 B2    10/2008 Radke et al.
7,447,970 B2 *  11/2008 Wu ..................... H03M 13/451
                                                            714/751
(Continued)

FOREIGN PATENT DOCUMENTS

KR         101206176 B1    11/2012

OTHER PUBLICATIONS

Yu-Peng Hu et al., "An Elestic Error Correction Code Technique for NAND Flash-based Consumer Electronic Devices", IEEE, 2013, 1-8 pages.
(Continued)

*Primary Examiner* — John J Tabone, Jr.
(74) *Attorney, Agent, or Firm* — Harness, Dickey, & Pierce P.L.C.

(57) ABSTRACT

A memory system includes a memory controller; and a memory device, the memory device including a memory cell array, the memory cell array including least a first memory page having a plurality of memory cells storing a plurality of stored bits, the memory controller being such that, the memory controller performs a first hard read operation on the first memory page to generate a plurality of read bits corresponding to the plurality of stored bits, and if the memory controller determines to change a value of one of a first group of bits, from among the plurality of read bits, the memory controller selects one of the first group of bits based on log likelihood ratio (LLR) values corresponding, respectively, to each of the first group of bits, and changes the value of the selected bit.

17 Claims, 15 Drawing Sheets

(51) Int. Cl.
    *G11C 29/52*     (2006.01)
    *H03M 13/15*     (2006.01)

(52) U.S. Cl.
    CPC .......... *G06F 3/0653* (2013.01); *G06F 3/0679* (2013.01); *G11C 29/52* (2013.01); *H03M 13/152* (2013.01); *H03M 13/1515* (2013.01)

(58) Field of Classification Search
    USPC ....... 714/764, 768, 773, 774, 780, 782, 784, 714/799
    See application file for complete search history.

(56) References Cited

U.S. PATENT DOCUMENTS

| | | | |
|---|---|---|---|
| 8,046,660 B2 | 10/2011 | Wu et al. | |
| 8,145,981 B2* | 3/2012 | Mokhlesi | G06F 11/1068 714/773 |
| 8,234,545 B2* | 7/2012 | Shalvi | G06F 11/1068 714/768 |
| 8,359,518 B2 | 1/2013 | Rumbolt et al. | |
| 8,433,985 B2 | 4/2013 | Kwok et al. | |
| 8,874,994 B2* | 10/2014 | Sharon | G06F 11/1072 714/766 |
| 8,996,958 B2* | 3/2015 | Cideciyan | G06F 11/1072 714/773 |
| 9,318,166 B2* | 4/2016 | Sharon | G06F 11/1044 |
| 2008/0282106 A1* | 11/2008 | Shalvi | G06F 11/1068 714/6.12 |
| 2012/0198314 A1 | 8/2012 | Yang et al. | |
| 2012/0290899 A1* | 11/2012 | Cideciyan | G06F 11/1072 714/773 |
| 2013/0024747 A1* | 1/2013 | Sharon | G06F 11/1072 714/773 |
| 2013/0024748 A1* | 1/2013 | Sharon | G06F 11/1072 714/773 |
| 2013/0132793 A1 | 5/2013 | Ha et al. | |

OTHER PUBLICATIONS

Sung Gun Cho, "Block-wise Concatenated BCH Codes for NAND Flash Memory and Decoding Strategies" Master's Thesis, 2012.
Ren-Shuo Liu et al., "Optimizing NAND Flash-Based SSDs via Retention Relaxation", article, 2012, pp. 1-13.

* cited by examiner

FIG. 6A

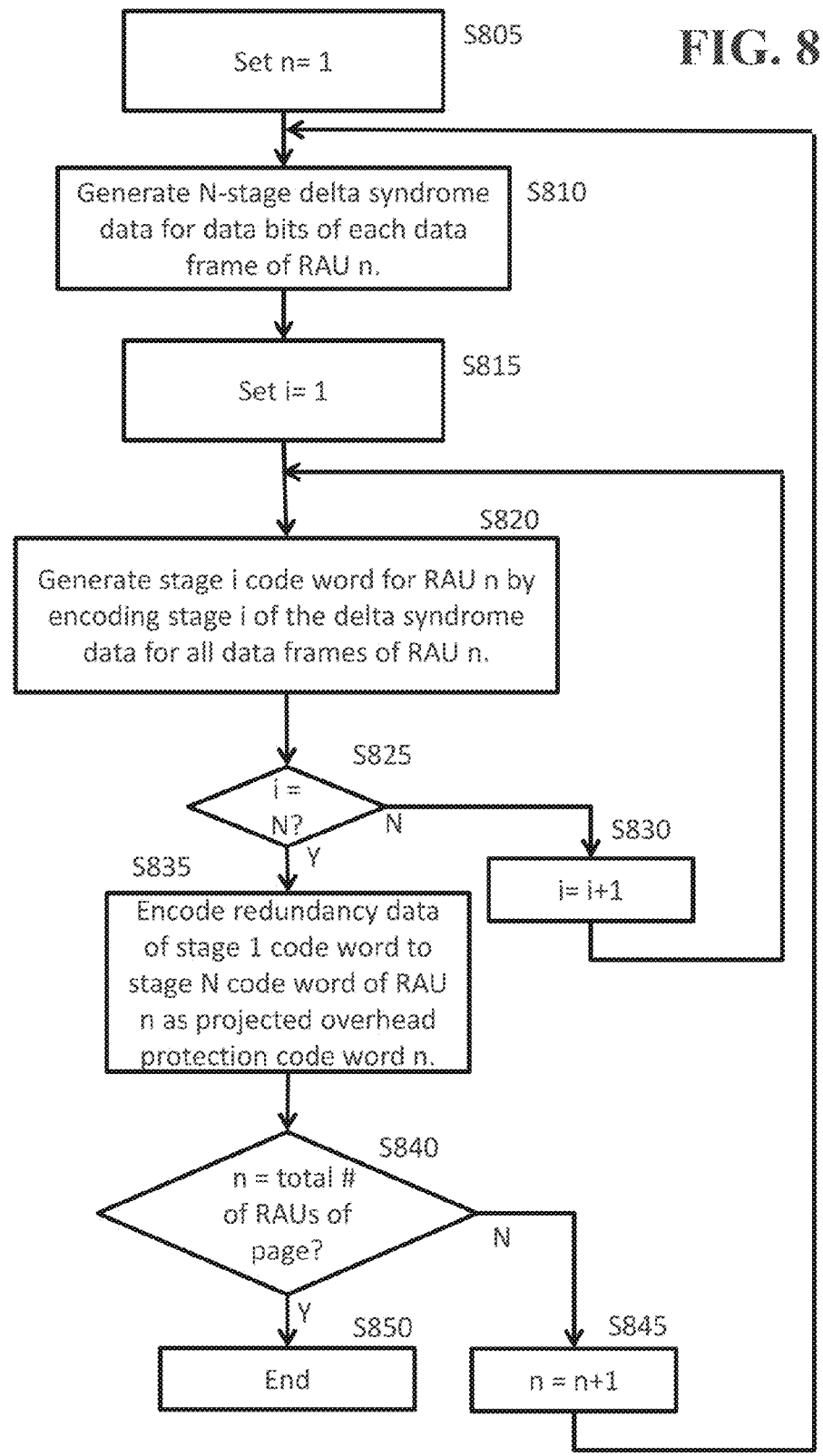

METHOD AND APPARATUS FOR ENCODING AND DECODING DATA IN MEMORY SYSTEM

BACKGROUND

1. Field

One or more example embodiments of the inventive concepts relate to methods and apparatuses for encoding and decoding data in a memory system.

2. Related Art

NAND flash memory is one example of electrically erasable and programmable read only memory (EEPROM). A NAND flash memory may store large amounts of information in a small chip area by using NAND cell units where a plurality of memory cells are connected in series to each other.

An error may arise when data is stored at a memory device and stored data is read from the memory device. Various error correction codes may be used to detect and correct such errors. The error correction codes may include a Reed-Solomon (RS) code, a Bose-Chaudhuri-Hocquenghem (BCH) code, a Low Density Parity Check (LDPC) code, and so on.

SUMMARY

Provided are methods and apparatuses for encoding data, programming the encoded data onto an already-programmed memory page without erasing the memory page, and decoding the programmed encoded data.

According to at least some example embodiments of the inventive concepts, a memory system includes a memory controller; and a memory device, the memory device including a memory cell array, the memory cell array including least a first memory page having a plurality of memory cells storing a plurality of stored bits, the memory controller being configured such that, the memory controller performs a first hard read operation on the first memory page to generate a plurality of read bits corresponding to the plurality of stored bits, the memory controller generates an operation value, the memory controller determines, based on the operation value, whether or not to change a value of one of a first group of bits, the first group of bits being bits from among the plurality of read bits, and if the memory controller determines to change a value of one of the first group of bits, the memory controller selects one of the first group of bits based on log likelihood ratio (LLR) values corresponding, respectively, to each of the first group of bits, and changes the value of the selected bit.

The memory controller may be further configured such that, the memory controller performs a first Bose-Chaudhuri-Hocquenghem (BCH) error correcting code (ECC) decoding operation to correct errors among the plurality of read bits generated by the first hard read operation, and when the memory controller determines to change one of the first group of bits, the memory controller performs a second BCH ECC decoding operation on the plurality of read bits, including the selected bit the value of which was changed, to correct additional errors among the plurality of read bits.

The first page may be configured such that, the plurality of stored bits are arranged in a plurality of rows and a plurality of columns, the plurality of rows including a plurality of data frames and at least one parity frame, the at least one parity frame includes a plurality of parity values corresponding, respectively, to a plurality of column groups, each of the plurality of column groups including at least one of the plurality of columns of the first page, and each one of the plurality of parity values is the result of an XOR operation performed on each of the bits, from among the stored bits, that are included in one of the data frames and included in the column group to which the parity value corresponds.

The memory controller may be configured to designate each of the plurality of data frames as being one of one or more error frames or one of or more correct frames, based on the results of at least one of the first and second BCH ECC decoding operations.

The memory controller may be configured such that, the first group of bits are bits, from among the read bits, that correspond to a first group of stored bits, the first group of stored bits are bits, from among the plurality of stored bits, that are included in a first column group from among the plurality of column groups, each bit of the first group of stored bits is included in a data frame from among the one or more error frames, and the memory controller obtains, as the operation value, a value generated based on a result of performing an XOR operation on, the parity value, from among the plurality of parity values, that corresponds to the first column group, and first correct bits, the first correct bits being bits that are included in the first column group and are not included in a data frame from among the one or more error frames.

The memory controller may be configured such that, the memory controller generates a comparison result based on the operation value and a result of an XOR operation performed on the first group of bits, and the memory controller determines whether or not to change the value of one of the first group of bits based on the comparison result.

According to at least some example embodiments of the inventive concepts, a memory system includes a memory controller; and a memory device, the memory device including a memory cell array, the memory cell array including least a first memory page having a plurality of memory cells, the memory controller being configured to, receive a plurality of bits from an external device, generate a plurality of first data code words by performing error correcting code (ECC) encoding on the received plurality bits, each of the plurality of first data code words including first data bits and first redundancy bits, the first redundancy bits providing an initial error correction capability with respect to the first data bits, store the plurality of first data code words, respectively, as a plurality of data frames in the first memory page, and generate delta syndrome data, the generated delta syndrome data including at least a plurality of first stage delta syndromes corresponding to the plurality of first data code words, respectively, such that, for each first data code word, of the plurality of first data code words, the first stage delta syndrome that corresponds to the first data code word provides a first stage error correction capability, the first stage error correction capability being an additional error correction capability with respect to the initial error correction capability provided by the first redundancy bits of the first data code word.

The memory controller may be configured to generate the plurality of first data code words by performing Bose-Chaudhuri-Hocquenghem (BCH) ECC encoding such that the plurality of first data code words are BCH code words.

The memory controller may be configured such that, the generated delta syndrome data generated by the memory controller includes, for each of the plurality of first data code words, N stages of delta syndromes, N being a positive integer, delta syndromes of different stages among the N stages of delta syndromes having different additional error correction capabilities with respect to the initial error correction capability provided by the first redundancy bits of the first data code words to which the delta syndromes of different stages among the N stages of delta syndromes correspond, delta syndromes of the same stage among the N stages of delta syndromes having the same additional error correction capabilities with respect to the initial error correction capability provided by the first redundancy bits of the first data code words to which the delta syndromes of same stage among the N stages of delta syndromes correspond.

The memory controller may be configured to generate N stages of second code words corresponding, respectively, to the N stages of delta syndromes such that, the second code words are Reed-Solomon (RS) code words each including second redundancy bits, a stage i second code word, among the N stages of second code words, is generated by performing RS encoding on stage i delta syndromes, among the N stages of delta syndromes, and a total number of the second redundancy bits included in a second code word, from among the N stages of second code words, is inversely related to a total number of bits the additional error correction capability of one of the delta syndromes encoded by the second code word is capable of correcting.

The memory controller may be configured to generate a projected overhead protection code word by performing an ECC encoding operation on the second redundancy bits of each of the N stages of second code words, and the memory controller may be configured to store the projected overhead protection code word in the memory device.

The memory controller may be configured such that, bits of the plurality of first data code words include a plurality of rows and a plurality of columns, the plurality of rows corresponding to the plurality of data frames, the memory controller generates at least one parity frame such that, the at least one parity frame includes a plurality of parity values corresponding, respectively, to a plurality of column groups, each of the plurality of column groups including at least one of the plurality of columns, and each one of the plurality of parity values is the result of an XOR operation performed by the memory controller on bits, from among the bits of the plurality of first data code words, that are included in one of the data frames and included in the column group to which the parity value corresponds, and the memory controller stores the at least one parity frame in the first memory page.

According to at least some example embodiments of the inventive concepts, a memory system includes a memory controller; and a memory device, the memory device including a memory cell array, the memory cell array including least a first memory page having a plurality of memory cells storing a plurality of stored bits; the memory controller is configured to perform a first hard read operation on the first memory page to generate a plurality of first code words corresponding to the plurality of stored bits, the plurality of first code words each including first data bits and first redundancy bits, the first redundancy bits providing an initial error correction capability, the memory controller is configured to perform a first error correcting code (ECC) decoding operation to correct errors among the first data code words using the initial error correction capabilities of the first redundancy bits of the first data code words, the memory controller is configured to determine whether or not to augment initial correction capabilities of the one or more error code words, each of the one or more error code words being a first data code word, from among the plurality of first data code words, having a number of bits errors that exceeds an initial correction capability of the first redundancy bits of the first data code word, and the memory controller is configured such that, if the memory controller determines to augment the initial correction capabilities of the one or more error code words, the memory controller generates one or more first delta syndromes corresponding, respectively, to the one or more error code words, each of the one or more first delta syndromes having a first additional error correction capability, and the memory controller augments the initial correction capabilities of the one or more error code words by performing a second error correcting code (ECC) decoding operation to correct errors among the one or more error code words using the initial error correction capabilities of the first redundancy bits of the one or more error code words augmented by the first additional error correction capabilities of the one or more first delta syndromes.

The plurality of first data code words are Bose-Chaudhuri-Hocquenghem (BCH) code words, and the first and second ECC decoding operations may be BCH decoding operations.

The memory controller may be configured to obtain, based on overhead protection data stored in the memory device, second redundancy bits of at least one second code word, the at least one second code word being a code word generated by performing Reed-Solomon (RS) encoding on a plurality of first delta syndromes, the memory controller may be configured to determine a total number of the one or more error code words based on the first ECC decoding operation, and the memory controller may be configured to determine whether or not to augment the initial correction capabilities of the one or more error code words by, deciding to augment the initial correction capabilities of the one or more error code words if a maximum number of delta syndromes, from among the plurality of first delta syndromes, that can be reconstructed by the memory controller using the second redundancy bits is not less than a total number of the one or more error code words, and deciding not to augment the initial correction capabilities of the one or more error code words if a maximum number of delta syndromes, from among the plurality of first delta syndromes, that can be reconstructed by the memory controller using the second redundancy bits is less than a total number of the one or more error code words.

The memory controller may be configured such that, when the memory controller decides to augment the initial correction capabilities of the one or more error code words, the memory controller calculates first delta syndromes based on the data bits of correct first code words, each of the correct first code words being a first code word, from among the plurality of first code words, that is not one of the one or more error code words, and the memory controller obtains the one or more first delta syndromes of the one or more error frames by performing an RS decoding operation to reconstruct the one or more first delta syndromes of the one or more error frames, the RS decoding operation being performed using the calculated first delta syndromes and the second redundancy bits.

The memory controller may be configured to obtain the second redundancy bits of at least one second code word by performing a BCH decoding operation on the overhead protection data stored in the memory device.

BRIEF DESCRIPTION OF THE DRAWINGS

Example embodiments of inventive concepts will be more clearly understood from the following detailed description taken in conjunction with the accompanying drawings in which:

FIG. 6A is a diagram of a portion of a memory page for explaining a page soft read/decode operation according to at least one example embodiment of the inventive concepts.

FIG. 8 is a flow chart illustrating a projected ECC encoding method according to at least one example embodiment of the inventive concepts.

DETAILED DESCRIPTION OF EXAMPLE EMBODIMENTS

Figure 1:
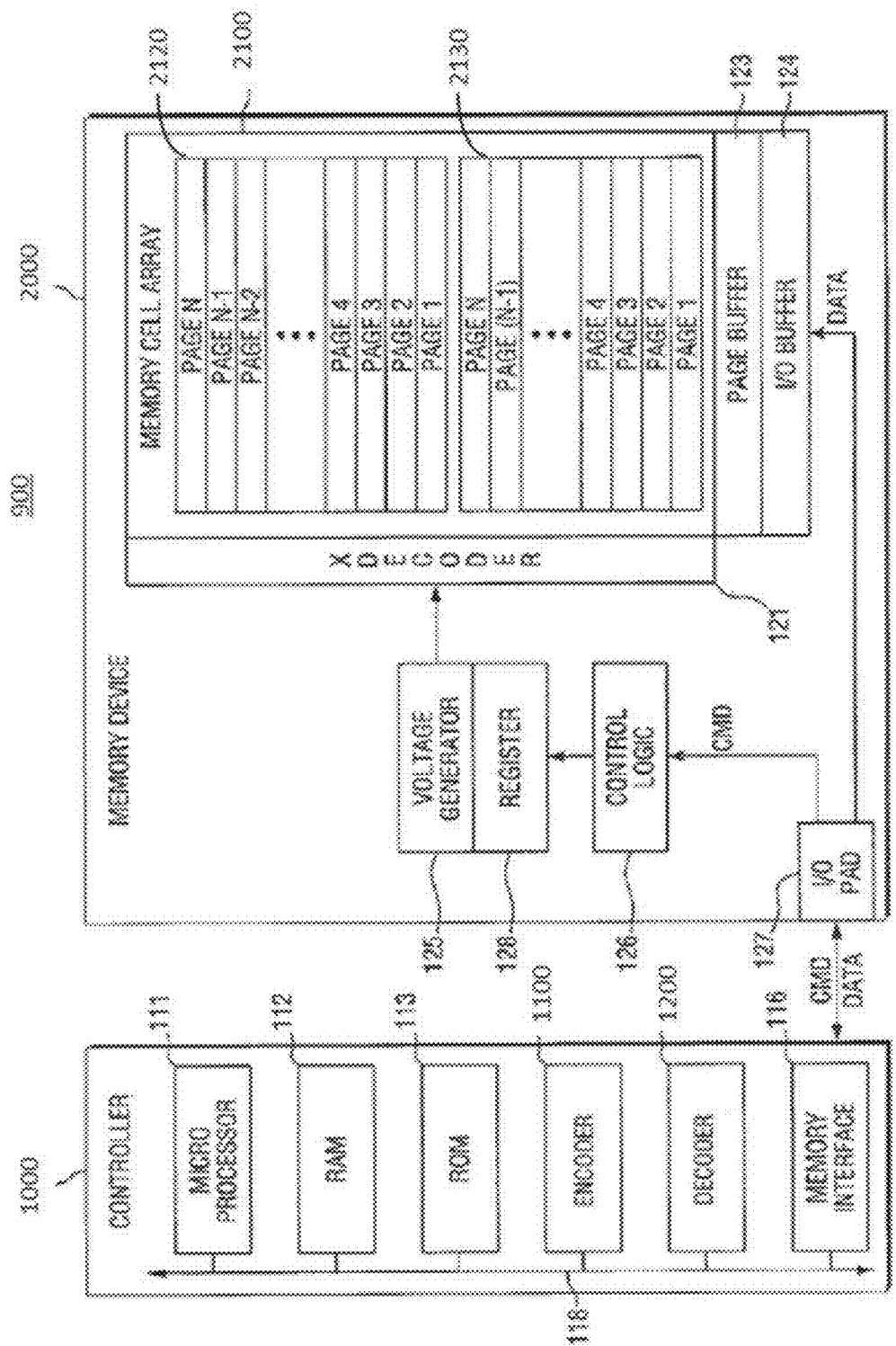
FIG. 1 is a diagram showing a memory system according to at least one example embodiment of the inventive concepts.

Example embodiments will now be described more fully with reference to the accompanying drawings. Many alternate forms may be embodied and example embodiments should not be construed as limited to example embodiments set forth herein. In the drawings, like reference numerals refer to like elements.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Unless specifically stated otherwise, or as is apparent from the discussion, terms such as "processing" or "computing" or "calculating" or "determining" or "displaying" or the like, refer to the action and processes of a computer system, or similar electronic computing device, that manipulates and transforms data represented as physical, electronic quantities within the computer system's registers and memories into other data similarly represented as physical quantities within the computer system memories or registers or other such information storage, transmission or display devices.

Specific details are provided in the following description to provide a thorough understanding of example embodiments. However, it will be understood by one of ordinary skill in the art that example embodiments may be practiced without these specific details. For example, systems may be shown in block diagrams so as not to obscure the example embodiments in unnecessary detail. In other instances, well-known processes, structures and techniques may be shown without unnecessary detail in order to avoid obscuring example embodiments.

In the following description, illustrative embodiments will be described with reference to acts and symbolic representations of operations (e.g., in the form of flow charts, flow diagrams, data flow diagrams, structure diagrams, block diagrams, etc.) that may be implemented as program modules or functional processes include routines, programs, objects, components, data structures, etc., that perform particular tasks or implement particular abstract data types and may be implemented using existing hardware in existing electronic systems (e.g., nonvolatile memories universal flash memories, universal flash memory controllers, nonvolatile memories and memory controllers, digital point-and-shoot cameras, personal digital assistants (PDAs), smartphones, tablet personal computers (PCs), laptop computers, etc.). Such existing hardware may include one or more Central Processing Units (CPUs), digital signal processors (DSPs), application-specific-integrated-circuits (ASICs), field programmable gate arrays (FPGAs) computers or the like.

Although a flow chart may describe the operations as a sequential process, many of the operations may be performed in parallel, concurrently or simultaneously. In addition, the order of the operations may be re-arranged. A process may be terminated when its operations are completed, but may also have additional steps not included in the figure. A process may correspond to a method, function, procedure, subroutine, subprogram, etc. When a process corresponds to a function, its termination may correspond to a return of the function to the calling function or the main function.

As disclosed herein, the term "storage medium", "computer readable storage medium" or "non-transitory computer readable storage medium" may represent one or more devices for storing data, including read only memory (ROM), random access memory (RAM), magnetic RAM, core memory, magnetic disk storage mediums, optical storage mediums, flash memory devices and/or other tangible machine readable mediums for storing information. The term "computer-readable medium" may include, but is not limited to, portable or fixed storage devices, optical storage devices, and various other mediums capable of storing, containing or carrying instruction(s) and/or data.

Furthermore, example embodiments may be implemented by hardware, software, firmware, middleware, microcode, hardware description languages, or any combination thereof. When implemented in software, firmware, middleware or microcode, the program code or code segments to perform the necessary tasks may be stored in a machine or computer readable medium such as a computer readable storage medium. When implemented in software, a processor or processors may be programmed to perform the necessary tasks, thereby being transformed into special purpose processor(s) or computer(s).

A code segment may represent a procedure, function, subprogram, program, routine, subroutine, module, software package, class, or any combination of instructions, data structures or program statements. A code segment may be coupled to another code segment or a hardware circuit by passing and/or receiving information, data, arguments, parameters or memory contents. Information, arguments, parameters, data, etc. may be passed, forwarded, or transmitted via any suitable means including memory sharing, message passing, token passing, network transmission, etc.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

FIG. 1 is a block diagram of a memory system to which a memory according to some embodiments of the present inventive concept is applied. Referring to FIG. 1, the memory system 900 includes the memory controller 1000 and a nonvolatile memory device 2000.

The nonvolatile memory device 2000 may be, but is not limited to, a flash memory device, a NAND flash memory device, a phase change RAM (PRAM), a ferroelectric RAM (FRAM), a magnetic RAM (MRAM), etc. According to at least one example embodiment of the inventive concepts, the nonvolatile memory device 2000 may include a plurality of NAND flash memory devices. The nonvolatile memory device 2000 may have a planar structure or a three-dimensional (3D) memory cell structure with a stack of memory cells.

The nonvolatile memory device 2000 may include a memory cell array 2100, an X decoder 121, a voltage generator 125, an I/O buffer 124, a page buffer 123, and a control logic 126 each of which may be implemented as one or more circuits. The memory device may also include an input/output (I/O) pad 127.

The memory cell array 2100 includes a plurality of word lines W/L and a plurality of bit lines B/L. Each memory cell of the memory cell array 2100 may be implemented as a nonvolatile memory cell. For example, each memory cell of the memory cell array 2100 may have, for example, a floating gate or a charge storage layer such as a charge trapping layer.

The memory cell array 2100 may include a plurality of blocks and a plurality of pages. One block includes a plurality of pages. A page may be a unit of program and read operations, and a block may be a unit of erase operation. For example, the memory cell array 2100 includes a first block 2120 and a second block 2130. As is illustrated n FIG. 1A, the first block 2120 includes pages 1-N, and the second block 2130 includes pages 1-N, where N is a positive integer greater than 1.

The control logic 126 controls the overall operation of the nonvolatile memory device 2000. When receiving a command CMD from the memory controller 1000, the control logic 126 interprets the command CMD and controls the nonvolatile memory device 2000 to perform an operation (e.g., a program operation, a read operation, a read retry operation, or an erase operation) according to the interpreted command CMD.

The X decoder 121 is controlled by the control logic 126 and drives at least one of the word lines W/L in the memory cell array 2100 according to a row address.

The voltage generator 125 is controlled by the control logic 126 to generate one or more voltages required for a program operation, a read operation or an erase operation and provide the generated voltages to one or more rows selected by the X decoder 121.

A register 128 is a space in which information input from the memory controller 1000 is stored and may include a plurality of latches. For example, the register 128 may group read voltage information and store the information in the form of a table.

The page buffer 123 is controlled by the control logic 126 and operates as a sense amplifier or a write driver according to an operation mode (e.g., a read operation or a program operation).

The I/O pad 127 and the I/O buffer 124 may serve as I/O paths of data exchanged between an external device, e.g., the memory controller 1000 or a host and the nonvolatile memory device 2000.

The memory controller 1000 may include a microprocessor 111, a read-only memory (ROM) 113, a random access memory (RAM) 112, an encoder 1100, a decoder 1200, a memory interface 116, and a bus 118. The elements 111 through 116 of the memory controller 1000 may be electrically connected to each other through the bus 118.

The microprocessor 111 is a controls the overall operation of the memory system 900 including the memory controller 1000. The microprocessor 111 is a circuit that controls other elements by generating control signals. When power is supplied to the memory system 900, the microprocessor 111 drives firmware (e.g., stored in the ROM 113) for operating the memory system 900 on the RAM 112, thereby controlling the overall operation of the memory system 900. According to at least one example embodiment of the inventive concepts, the microprocessor 111 may also issue instructions for controlling operations of other elements of the memory controller 1000 including, for example, some or all of the ROM 113, RAM 112, encoder 1100, decoder 1200, memory interface 116, and a bus 118. According to at least one example embodiment of the inventive concepts, any operations described herein as being performed by the memory controller 1000 may be performed by, or under the control of, the microprocessor 111. According to at least one example embodiment of the inventive concepts, any operations described herein as being performed by the memory controller 1000 may be performed by, or under the control of, the microprocessor 111 executing instructions that correspond to the operations and are included in program code (e.g., stored in the ROM 113).

While a driving firmware code of the memory system 900 is stored in the ROM 113, one or more example embodiments of the inventive concepts are not limited thereto. The firmware code can also be stored in a portion of the nonvolatile memory device 2000 other than the ROM 113. Therefore, the control or intervention of the microprocessor 111 may encompass not only the direct control of the microprocessor 111 but also the intervention of firmware which is software driven by the microprocessor 111.

The RAM 112, which is a memory serving as a buffer, may store an initial command, data, and various variables input from a host or the microprocessor 111, or data output from the nonvolatile memory device 2000. The RAM 112 may store data and various parameters and variables input to and output from the nonvolatile memory device 2000.

The memory interface 116 may serve as an interface between the memory controller 1000 and the nonvolatile memory device 2000. The memory interface 116 is connected to the I/O pad 127 of the nonvolatile memory device 2000 and may exchange data with the I/O pad 127. In addition, the memory interface 116 may create a command suitable for the nonvolatile memory device 2000 and provide the created command to the I/O pad 127 of the nonvolatile memory device 2000. The memory interface 116 provides a command to be executed by the nonvolatile memory device 2000 and an address ADD of the nonvolatile memory device 2000.

According to at least one example embodiment of the inventive concepts, the decoder 1200 may be an error correcting code (ECC) decoder, and the encoder 1100 may be an ECC encoder. According to at least one example embodiment of the inventive concepts, the decoder 1200 and the encoder 1100 perform error bit correction. The encoder 1100 may generate data added with one or more parity and/or redundancy bits by performing error correction encoding on data before the data is provided to the nonvolatile memory device 2000. The one or more parity and/or redundancy bits may be stored in the nonvolatile memory device 2000.

The decoder 1200 may perform error correction decoding on output data, determine whether the error correction decoding is successful based on the result of the error correction decoding, and output an instruction signal based on the determination result. Read data may be transmitted to the decoder 1200, and the decoder 1200 may correct error bits of the data using the one or more parity and/or redundancy bits. When the number of error bits exceeds a limit of error bits that can be corrected, the decoder 1200 cannot correct the error bits, resulting in error correction failure. The encoder 1100 and the decoder 1200 may perform error correction using, for example, one or more of low density parity check (LDPC) code, Bose-Chaudhuri-Hocquenghem (BCH) code, turbo code, Reed-Solomon (RS) code, convolution code, recursive systematic code (RSC), or coded modulation such as trellis-coded modulation (TCM) or block coded modulation (BCM).

In general, BCH codes may allow for relatively low power use and low silicon area usage. However, BCH codes may also provide low bit error rate (BER) coverage. Further, in general, LDCP codes may allow for relatively high BER coverage. However, LDCP codes may also be associated with relatively high power usage, high silicon area, and marginal throughput at high raw BER values.

Each of the encoder 1100 and the decoder 1200 may include an error correction circuit, system or device.

Figure 2:
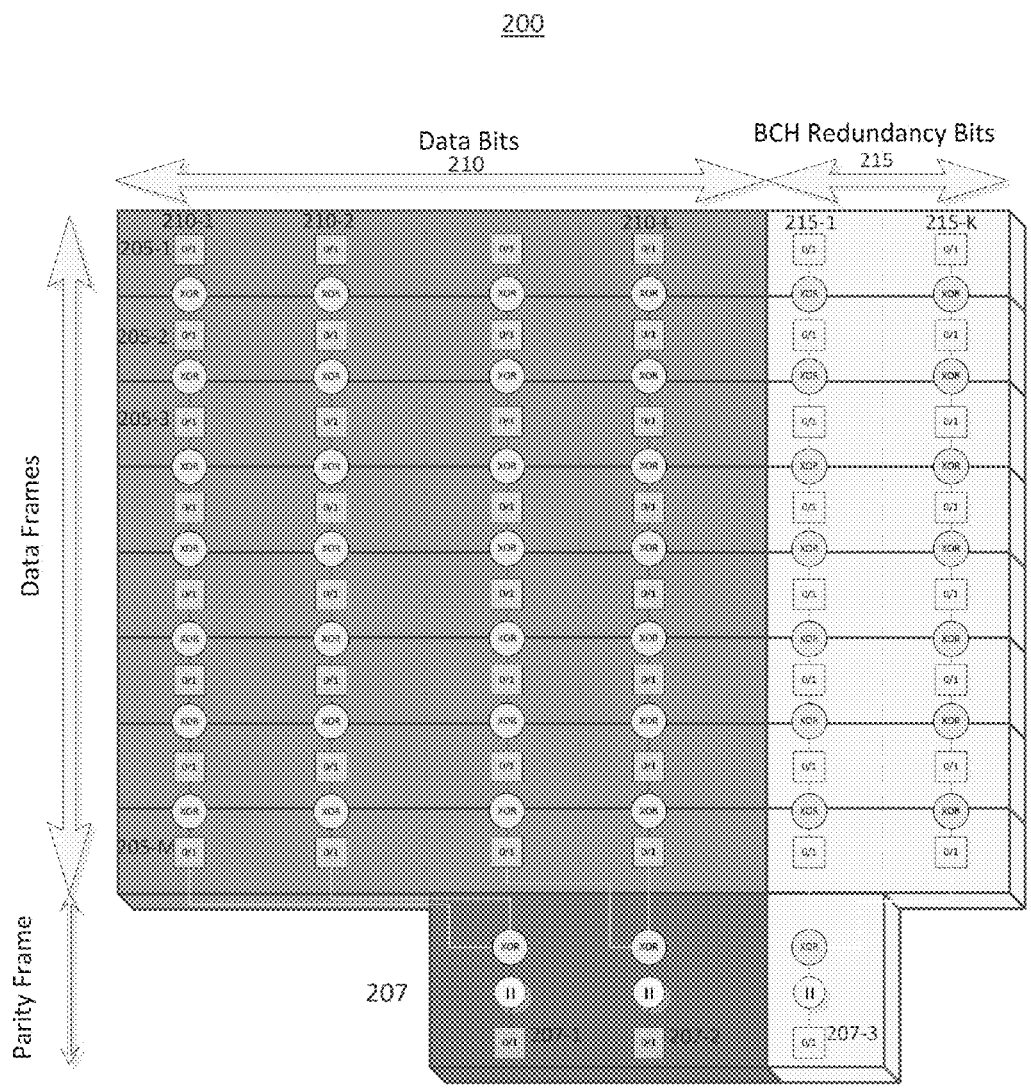
FIG. 2 is a diagram showing a structure of a memory page according to at least one example embodiment of the inventive concepts.

FIG. 2 is a diagram showing a structure of a memory page according to at least one example embodiment of the inventive concepts.

FIG. 2 illustrates a memory page 200. Memory page 200 illustrates an example structure of the memory pages of the memory cell array 2100. Memory page 200 will be explained with reference to an example in which the memory page 200 is a Page 1 of the first memory block 2120. However, according to at least one example embodiment of the inventive concepts, at least some, or alternatively, all of the memory pages in the memory cell array 2100 may have the same structure as that described herein with respect to the memory page 200. Further, operations described herein as being performed on or with the memory page 200 may be performed on or with at least some, or alternatively, all of the memory pages within the memory cell array 2100.

Information is stored in the memory page 200 as a plurality of data frames 205 and a parity frame 207. The data frames 205 include data frames 205-1 to 205-M, where M is a positive integer greater than 1. As is illustrated in FIG. 2, each of the data frames 205 includes data bits 210 and corresponding redundancy bits 215. The data bits 210 may be arranged in columns 210-1 to 210-L, and the redundancy bits may be arranged in columns 215-1 to 215-K, where L and K are both positive integers greater than 1. According to at least one example embodiment, as will be discussed in greater detail below with reference to FIG. 3, the redundancy bits 215 of each one of the data frames 205 are the result of ECC encoding performed on the corresponding data bits 210 of the data frame.

According to at least one example embodiment, a total size of the memory page 200 may be ~8 KB, a size of each frame among the data frames 205 may be ~2000 bits, and a size of the parity frame 207 may be ~1000 bits (i.e., half of the size of one of the data frames 205).

Further, according to at least one example embodiment of the inventive concepts, the parity frame 207 stores single parity check (SPC) bits corresponding to the data bits 210 and redundancy bits 215 of the memory page 200. For the purpose of explanation, three SPC bits, including first SPC bit 207-1 through third SPC bit 207-3, are illustrated in FIG. 2. For example, the SPC bits of the parity frame 207 may be determined using a folded scheme in which the XOR of the bits of two columns from among the bits of the memory page 200 are used to calculate a single SPC bit. Two columns of bits of the memory page 200 that are used to generate a signal SPC bit of the parity frame 207 are referred to herein as a folded column pair (FCP). For example, as is illustrated in FIG. 2, the result of an XOR operation performed on the bits of the first column of data bits 210-1 and the bits of the second column of data bits 210-2 is stored as the first SPC bit 207-1. Accordingly, the first column of data bits 210-1 and the second column of data bits 210-2 constitute the FCP used to calculate the first SPC bits 207-1. The other SPC bits (e.g., the second SPC bit 207-2 and the third SPC bit 207-3) may be calculated in the same manner discussed above with respect to the first SPC bit 207-1. Further, as is illustrated by the third SPC bit 207-3, the parity frame 207 also includes SPC bits representing the results of XOR operations performed on FCPs of the redundancy bits 215. Using the folded scheme, the size of the parity frame 207 may be half that of one of the data frames 205 thus reducing the amount of memory page space needed to store the SPC information, and increasing the amount of memory page space available for more data bits and/or redundancy bits.

Figure 3:
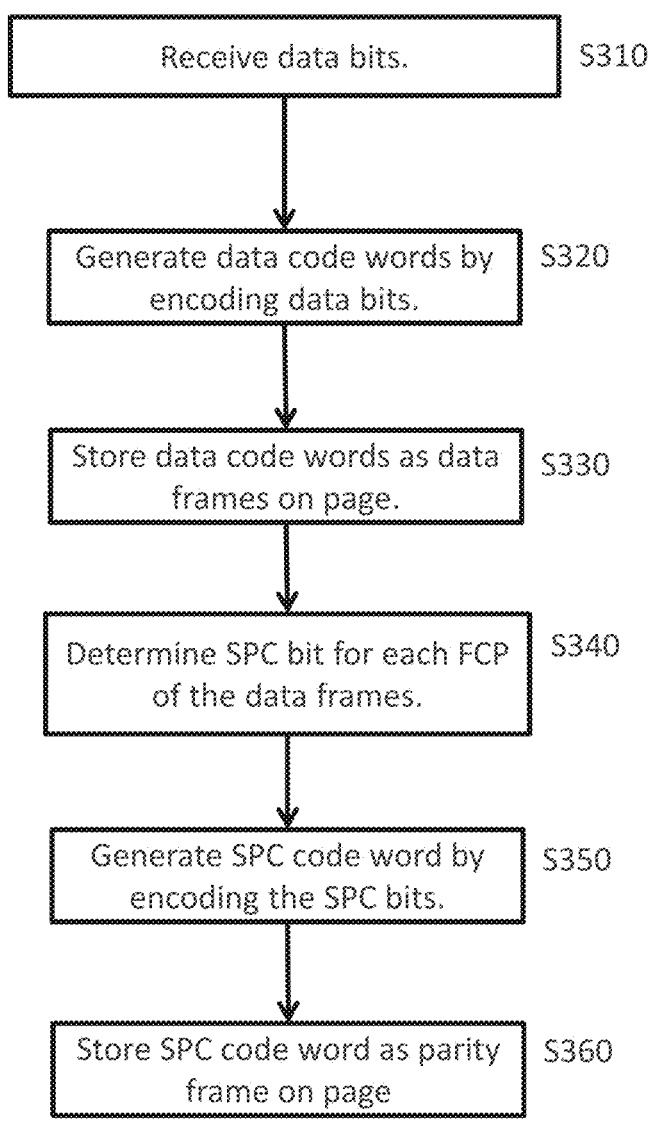
FIG. 3 is a flow chart illustrating an encoding method according to at least one example embodiment of the inventive concepts.

FIG. 3 is a diagram illustrating an encoding method according to at least one example embodiment of the inventive concepts. According to at least one example embodiment, the method illustrated in FIG. 3 may be performed, for example, by the memory controller 1000 illustrated in FIG. 1. For the purpose of clarity, FIG. 3 will be explained with reference to an example where data bits are encoded by the memory controller 1000 and stored as the page 200 within the memory cell array 2100.

Referring to FIG. 3, in step S310, the memory controller 1000 receives data bits. For example the memory controller 1000 may receive data bits from an exterior device including, for example, a host (not illustrated). According to at least one example embodiment, the encoder 1100 may receive the data bits from a host via the microprocessor 111.

In step S320, the memory controller 1000 generates data code words by encoding the data bits received in step S310. According to at least one example embodiment, in step S320, the encoder 1100 generates data code words using BCH code. Accordingly, the code words generated in step S320 may be BCH code words including data bits 210 and redundancy bits 215 corresponding to the data bits.

In step S330 the memory controller 1000 stores the data code words generated in step S320 as data frames on a page of memory within the memory cell array 2100. For example, in step S330, the memory controller 1000 may send the data code words generated in step S320 to the memory device 2000 along with one or more commands that control the memory device 2000 to store the data code words as frames in a memory page of the memory cell array 2100.

For example, in step S330, the memory controller 1000 may control the memory device 2000 to store the data code words generated in step S320 as the data frames 205 of memory page 200 illustrated in FIG. 2.

In step S340, the memory controller 1000 may determine the SPC bits for each FCP of the data code words generated in step S320. For example, in step S340, the memory controller 1000 may generate the SPC bits of each FCP corresponding to the bits of the data code words generated in step S320 in the same manner discussed above with respect to FIG. 2, by determining each SPC bit to be the result of an XOR operation performed on the bits of the FCP corresponding to each SPC bit.

In step S350, the memory controller 1000 may generate an SPC code word by encoding the SPC bits determined in step S340. According to at least one example embodiment, in step S350, the encoder 1100 generates an SPC code word using BCH code. Accordingly, the SPC code words generated in step S350 may be BCH code words including data bits 210 and redundancy bits 215 corresponding to the data bits.

Though steps S340 and S350 are illustrated as being performed after step S330, steps S340 and S350 may also be performed before or during the performance of step S330. For example, data bits of the data code words generated in step S320 may be stored in a buffer memory of the memory controller 1000 (e.g., the RAM 112). Further, steps S340 and S350 may be performed based on data bits of the data code words stored in the buffer memory of the memory controller 1000 before the data bits are stored in a page of the memory cell array 2100.

In step S360, the memory controller 1000 stores the SPC code word generated in Step S350 as a parity frame on a page of memory within the memory cell array 2100. For example, in step S360, the memory controller 1000 may send the SPC code word generated in step S350 to the memory device 2000 along with one or more commands that control the memory device 2000 to store the SPC code word as a frame in a memory page of the memory cell array 2100.

For example, in step S360, the memory controller 1000 may control the memory device 2000 to store the SPC code word generated in step S360 as the parity frame 207 of memory page 200 illustrated in FIG. 2.

A method of decoding the information stored, for example, in the memory page 200 will now be discussed in greater detail below with reference to FIG. 4.

Figure 4:
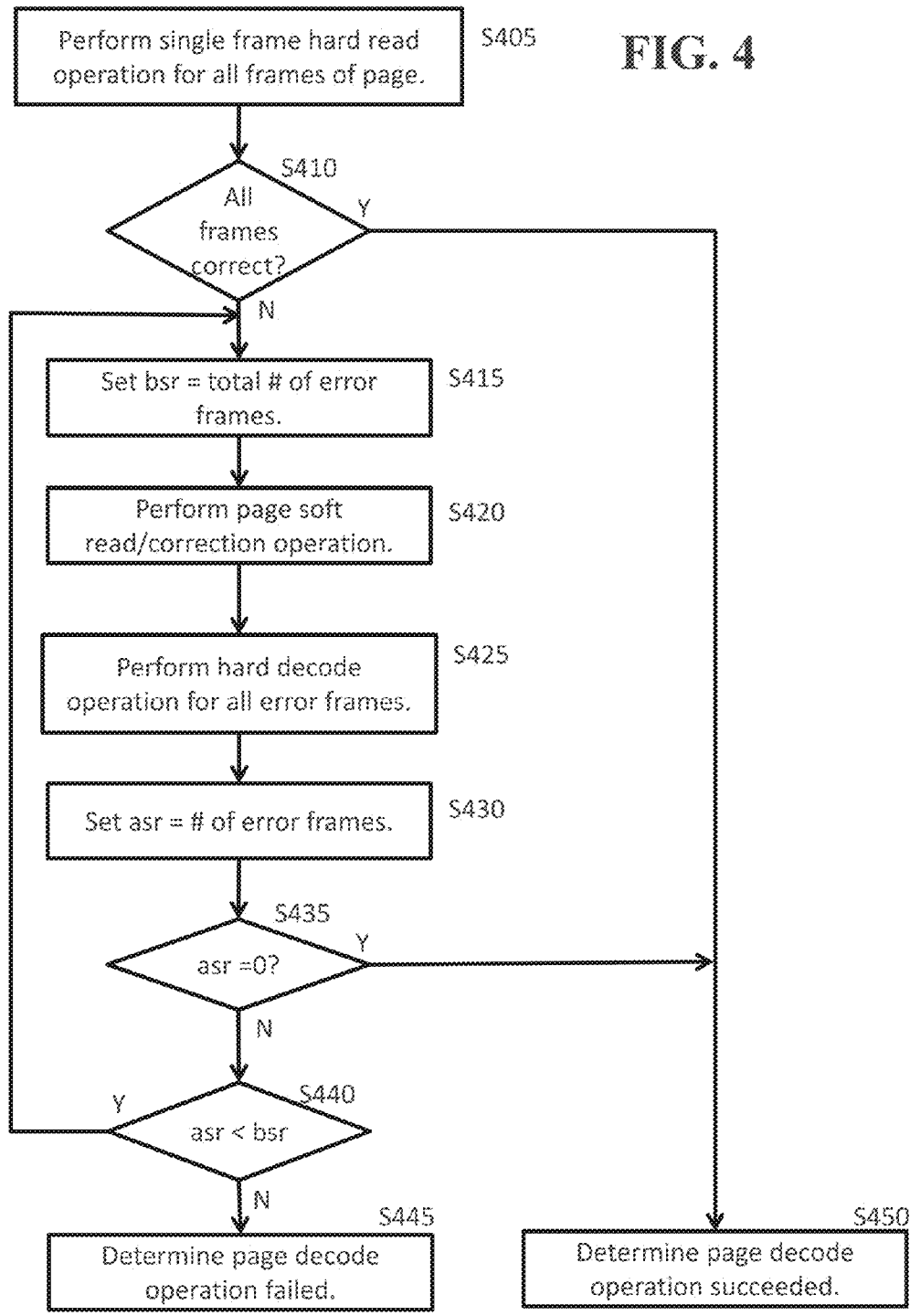
FIG. 4 is a flow chart illustrating a decoding method according to at least one example embodiment of the inventive concepts.

FIG. 4 is a diagram illustrating a decoding method according to at least one example embodiment of the inventive concepts. According to at least one example embodiment, the method illustrated in FIG. 4 may be performed, for example, by the memory controller 1000 illustrated in FIG. 1. For the purpose of clarity, FIG. 4 will be explained, in part, by referencing to FIGS. 5, 6A and 6B.

Further, FIGS. 4, 5, and 6B will be explained with reference to an example where data bits are read by the memory controller 1000 from the memory page 200 within the memory cell array 2100, and decoded by the memory controller 1000.

Referring to FIG. 4, in step S405, the memory controller 1000 performs a single frame hard read (SFHR) operation for all frames read from the memory page 200. The memory page 200 may be read by the memory controller 1000. An example of the SFHR operation is illustrated in FIG. 5.

Figure 5:
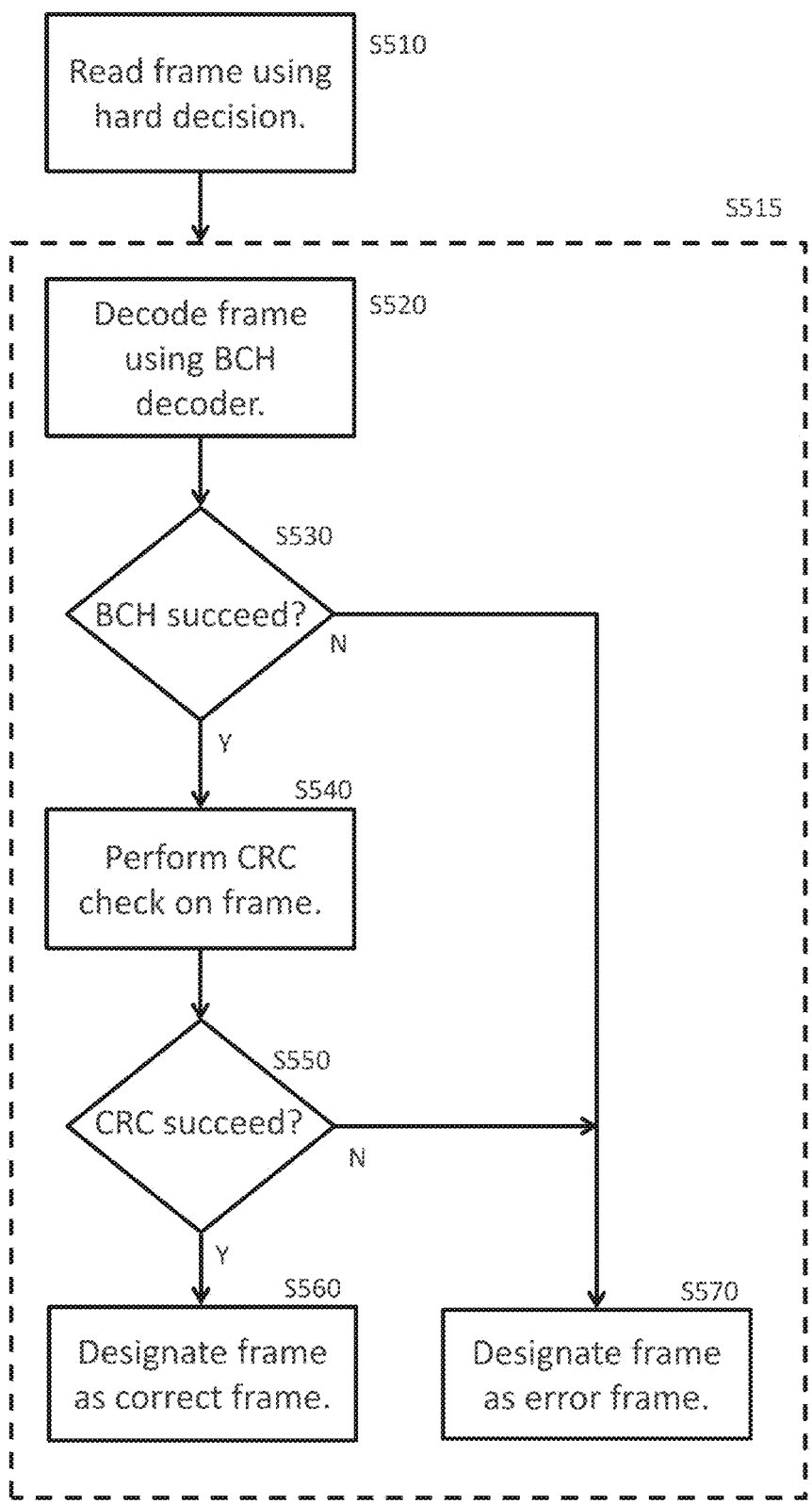
FIG. 5 is a flow chart illustrating a single frame hard read operation according to at least one example embodiment of the inventive concepts.

FIG. 5 is a diagram illustrating a single frame hard read operation according to at least one example embodiment of the inventive concepts. Referring to FIG. 5, according to at least some example embodiments, the SFHR operation includes two steps: a reading step S510 and a decoding step S515.

In step S510, the memory controller 1000 reads a frame of the data page 200 using a hard decision. For example, in step S510, the memory controller may read the first data frame 205-1 of the memory page 200. After step S510, the memory controller 1000 proceeds to the decoding step S515. In step S515 the memory controller 1000 performs a decoding operation that includes frame decoding and error checking. According to at least some example embodiments of the inventive concepts, the decoding operation of step S515 includes steps S520-S570.

In step S520, the memory controller 1000 performs ECC decoding on the data frame read in Step S520. For example, in step S520, the decoder 1200 may perform ECC decoding on the first data frame 205-1. According to at least one example embodiment of the inventive concepts, the data frames 205 stored in the memory page 200 are encoded using BCH code. Accordingly, in step S520, the decoder 1200 may perform a BCH decoding operation on the first data frame 205-1.

In step S530, the memory controller 1000 may determine whether or not the ECC decoding operation performed in step S520 succeeded. For example, when the ECC decoding is BCH decoding, the decoder 1200 may determine whether or not the BCH decoding operation succeeded in accordance with known processes for performing BCH decoding. According to at least one example embodiments of the inventive concepts, the decoder 1200 may generate a signal indicating to the memory controller 1000 (e.g., the microprocessor 111) whether or not the BCH decoding operation performed in step S520 succeeded. The BCH decoding operation performed in step S520 is considered to succeed when results of the BCH decoding operation indicated the frame has been successfully decoded.

If, in step S530, the memory controller 1000 (e.g., using the microprocessor 111) determines the BCH decoding of step S520 did not succeed, the memory controller 1000 proceeds to step S570. The BCH decoding operation performed in step S520 is considered not to have succeeded when results of the BCH decoding operation indicated the frame was not successfully decoded.

In step S570, the memory controller 1000 (e.g., using the microprocessor 111) may designate the frame read in step S510 (e.g., the first frame 205-1) as an error frame. For example, in step S570 the microprocessor may store frame designation data in the RAM 112 indicating that the first frame 205-1 is an error frame. The term "error frame", as used herein, refers to a data frame determined (e.g., by the memory controller 1000) to include at least one bit error.

Returning to step S530, if the memory controller 1000 (e.g., using the microprocessor 111) determines the BCH decoding of step S520 did succeed, the memory controller 1000 proceeds to step S540.

According to at least some example embodiments of the inventive concepts, in step S540 the memory controller 1000 (e.g., using the microprocessor 111) performs a CRC check on the frame read in step S510.

If, in step S550, the memory controller 1000 (e.g., using the microprocessor 111) determines the CRC check of step S530 did not succeed, the memory controller 1000 proceeds to step S570. CRC check of step S530 is considered not to have succeeded when a CRC check value calculated from the frame does not match a CRC check value read from the frame, in accordance with known CRC error detection methods.

If, in step S550, the memory controller 1000 (e.g., using the microprocessor 111) determines the CRC check of step S530 did succeed, the memory controller 1000 proceeds to step S560. The CRC check of step S530 is considered to succeed when a CRC check value calculated from the frame matches a CRC check value read from the frame, in accordance with known CRC error detection methods.

According to at least some example embodiments of the inventive concepts, steps S540 and S550 may be excluded from the hard decode operation of step S515. Thus, according to at least some example embodiments, the memory controller 1000 may proceed directly from step S530 to step S560 if the memory controller 1000 determines, in step S530, that the BCH decoding succeeds.

In step S560, the memory controller 1000 (e.g., using the microprocessor 111) may designate the frame read in step S510 (e.g., the first frame 205-1) as a correct frame. For example, in step S560 the microprocessor 111 may store frame designation data in the RAM 112 indicating that the first frame 205-1 is a correct frame. The term "correct frame", as used herein, refers to a data frame determined (e.g., by the memory controller 1000) to include no bit errors.

Returning to step S405 of FIG. 4, according to at least one example embodiment of the inventive concepts, after the memory controller 1000 performs the SFHR operation illustrated in FIG. 5 for every data frame of the memory page 200, the memory controller proceeds to step S410.

In step S410, the memory controller 1000 determines whether or not all the frames of the memory page 200 are designated as correct frames. For example, in step S410, the microprocessor 111 may check the frame designation data stored in the RAM 112 during the SFHR operations performed in step S405 to determine whether or not all the data frames 205 of the memory page 200 are designated as correct frames.

If, in step S410, the memory controller 1000 determines that all the data frames 205 of the memory page 200 are designated as correct frames, the memory controller proceeds to step S450. In step S450, the data decoding operation is determined to be a success, and the data decoding operation ends for the memory page 200.

If, in step S410, the memory controller 1000 determines that not all of the data frames 205 of the memory page 200 are designated as correct frames, the memory controller 1000 initiates a recursive data decoding routine including steps S415-S440.

In step S415, the memory controller 1000 sets a data value bsr to a total number of error frames. The value bsr represent a total number of error frames of the memory page 200 before the page soft read/correction operation of step S420 is performed. Step S420 will be discussed in greater detail below with reference to FIGS. 6A and 6B. For example, according to at least one example embodiment, in step S415, the microprocessor 111 may check the frame designation data stored in the RAM 112 to determine the total number of data frames 205 of the memory page 200 that are currently designated as error frames, and the microprocessor 111 may store the determined total number of error frames as the data value bsr in the RAM 112.

In Step S420, the memory controller 1000 performs a page soft read/correction operation. An example of the soft read operation will now be explained with reference to FIGS. 6A and 6B.

Figure 6A:
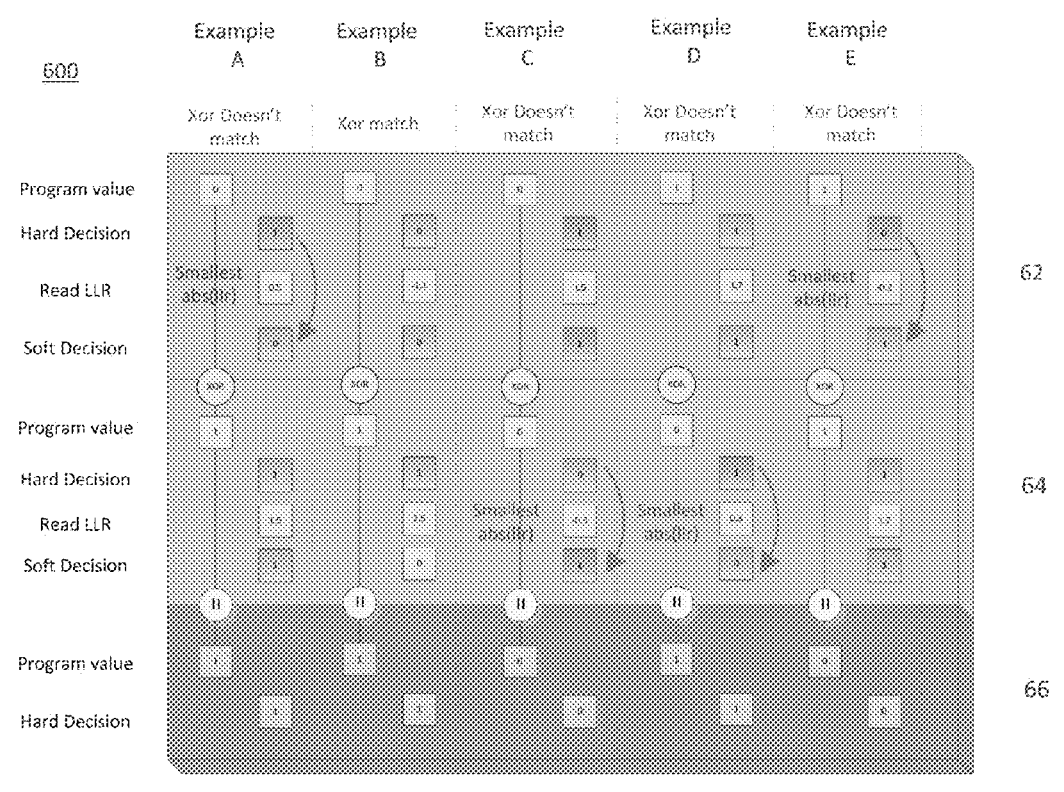

FIG. 6A is a diagram of a portion of a memory page for explaining a page soft read operation according to at least one example embodiment of the inventive concepts. Referring to FIG. 6A, FIG. 6A illustrates a portion of a memory page 600. Memory page 600 may have the same structure as the memory page 200 illustrated in FIG. 2, with the exception that, for the purpose of facilitating an explanation of the page soft rad operation, memory page 600 does not employ a folded scheme in which the XOR of the bits of two columns from among the bits of the memory page 600 are used to calculate a single SPC bit. For example, like the memory page 200, the memory page 600 also includes a parity frame that stores SPC bits corresponding to columns of data bits within the memory page 600. However, unlike the memory page 200, the SPC bits of the memory page 600 are calculated based on a single column, and not a folded pair of columns.

Memory page 600 includes a plurality of data frames. For the purpose of simplicity, only data frames 62 and 64 are illustrated. In the example illustrated in FIG. 6A, data frames 62 and 64 are error frames. For example, data frames 62 and 64 may be frames that the decoder 1200 was unable to successfully decode in steps S520 and S530 of FIG. 5 and/or a data frame that failed the CRC check described in steps S540 and S550.

FIG. 6 also illustrates the XOR operation values 64. There is an XOR operation value for each column in memory page 600. According to known properties of the XOR operation, when a single value from among a column of bits in the memory page 600 is unknown, the unknown value can be calculated by performing a XOR operation between the known values of the column and the SPC bit corresponding to the column. The result of such an XOR operation will be the correct value of the unknown value of the column. Thus, for each column of the memory page 600, the corresponding XOR operation value, from among the XOR operation values 64, represents the results of an XOR operation performed on bits of all the correct data frames for the column and the SPC bit for the column.

Further, it is known that the XOR of the unknown bits of a column should equal the XOR operation value of the column. As used herein, the term "unknown bits" refers to bits of an error frame or error frames. As will be discussed in greater detail below, the above-referenced feature of the XOR of unknown bits of a column is used along with log-likelihood ratios (LLRs) corresponding to the unknown bits to perform a soft read determination operation to determine which of the unknown bits should be flipped (i.e., changed in value).

For example, in FIG. 6A, for each of error frames 62 and 64, program values, hard decision values, read LLR values and soft decision values are illustrated. In FIG. 6A, the "program value" refers the original value programmed into a frame; the "hard decision" value refers to a value read from the frame in accordance with a SFHR operation (e.g., the SFHR operation illustrated in FIG. 5); the "Read LLR" values refer to LLR values calculated in accordance with a soft read operation performed by the memory controller 1000; and the "Soft Decision" value refers to the result of a soft read determination operation which is included in step S420 and will now be discussed in greater detail below with reference to examples A-E illustrated in FIG. 6A. For example, according to at least one example embodiment, the above-referenced soft read determination operation includes, for every column, checking for a zero sum (over GF(2)) of the bits in that column, where the zero sum is the result of XOR operations performed on the bits of the column including the SPC bit of the column.

For example, the soft read determination operation will now be explained with reference to example A illustrated in FIG. 6A. With reference to example A, the XOR of the hard decision value of the first column of error frame 62 (1) and the hard decision value of the first column of data frame 64 (1) is 1 XOR 1=0, and thus, does not equal the corresponding XOR operation value of the first column of error frame 62 (1). Accordingly, in order to make the XOR of the bits of the first column of data frames 62 and 64 equal the corresponding XOR operation value of the first column, one of the bits of the first column of data frames 62 and 64 is flipped. In order to choose which of the bits of the first column is to be flipped, the memory controller 1000, for example using the micro controller 111, compares absolute values of LLRs of the bits of the first column of the data frames 62 and 64, and chooses the bit having the smallest LLR as the bit that will be flipped. The absolute value of the LLR of the bit of the first column of data frame 62 (0.5) is lower than the absolute value of the LLR of the bit of the first column of the data frame 64 (1.5). Accordingly, the bit of the first column of data frame 62 is flipped from 1 to 0. As is shown in FIG. 6A, with respect to example A, the soft read determination operation results in flipping the bit of the first column of data frame 62, and thus, correcting the bit of the first column of the data frame 62 such that the flipped bit matches the originally programmed value. The LLRs of bits (i.e., read data values) can be calculated, for example by the memory controller 1000, according to known methods by using soft read operations where several read operations using different read voltages are applied to a memory cell to read a value stored in the memory cell.

A soft read determination operation will now be explained with reference to example B illustrated in FIG. 6A. In example B illustrated in FIG. 6A, the XOR of the hard decision value of the second column of data frame 62 (0) and the hard decision value of the second column of data frame 64 (1) is 0 XOR 1=1, and thus, does equal the corresponding XOR operation value of the second column (1). Accordingly, it is not necessary for the memory controller 1000 to flip a bit from among the bits of the second column of data frames 62 and 64 in order to make the XOR of the bits of the second column of data frames 62 and 64 equal the corresponding XOR operation value of the second column. As is shown in FIG. 6A, with respect to example B, the soft read determination operation correctly resulted in none the bits of the second column being flipped, and the bits of the second column of data frames 62 and 64 were correct without either of the bits being flipped (i.e., the bits of the second column of data frames 62 and 64 already matched the corresponding program values as illustrated in FIG. 6A without needing to be flipped).

A soft read determination operation will now be explained with reference to example C illustrated in FIG. 6A. In example C illustrated in FIG. 6A, the XOR of the hard decision value of the third column of data frame 62 (1) and the hard decision value of the third column of data frame 64 (0) is 1 XOR 0=1, and thus, does not equal the corresponding XOR operation value of the third column (0). Accordingly, one of the bits of the third column of data frames 62 and 64 is flipped. In order to choose which of the bits of the third column is to be flipped, in the same manner discussed above with respect to example A, the memory controller 1000 compares absolute values of LLRs of the bits of the third column of the data frames 62 and 64, and chooses the bit having the LLR with the smallest absolute value as the bit that will be flipped. The absolute value of the LLR of the bit of the third column of data frame 62 (1.5) is greater than the absolute value of the LLR of the bit of the third column of the data frame 64 (0.3). Accordingly, the bit of the third column of data frame 64 is flipped from 0 to 1. As is shown in FIG. 6A, example C is an example where the soft read determination operation results in flipping the bit of the third column of data frame 64, and does not result in correcting the bit of the data frame 64 because the flipped bit matched the corresponding program value before being flipped and not after.

A soft read determination operation will now be explained with reference to example D illustrated in FIG. 6A. In example D illustrated in FIG. 6A, the XOR of the hard decision value of the fourth column of data frame 62 (1) and the hard decision value of the fourth column of data frame 64 (1) is 1 XOR 1=0, and thus, does not equal the corresponding XOR operation value of the third column (1). Accordingly, one of the bits of the fourth column of data frames 62 and 64 is flipped. In the same manner discussed above with respect to Examples A and C, the memory controller 1000 compares absolute values of LLRs of the bits of the fourth column of the data frames 62 and 64, and chooses the bit having the LLR with the smallest absolute value as the bit that will be flipped. The absolute value of the LLR of the bit of the fourth column of data frame 62 (1.7) is greater than the absolute value of the LLR of the bit of the fourth column of the data frame 64 (0.3). Accordingly, the bit of the fourth column of data frame 64 is flipped from 1 to 0. As is shown in FIG. 6A, with respect to example D, the soft read determination operation results in flipping the bit of the fourth column of data frame 64, which results in correcting the bit of the fourth column of the data frame 64 such that the flipped bit matches the originally programmed value.

A soft read determination operation will now be explained with reference to example E illustrated in FIG. 6A. In example E illustrated in FIG. 6A, the XOR of the hard decision value of the fifth column of data frame 62 (0) and the hard decision value of the fifth column of data frame 64 (1) is 0 XOR 1=1, and thus, does not equal the corresponding XOR operation value of the third column (0). Accordingly, one of the bits of the fifth column of data frames 62 and 64 is flipped. In the same manner discussed above with respect to Examples A, C and D, the memory controller 1000 compares absolute values of LLRs of the bits of the fifth column of the data frames 62 and 64, and chooses the bit having the LLR with the smallest absolute value as the bit that will be flipped. The absolute value of the LLR of the bit of the fifth column of data frame 62 (0.7) is less than the absolute value of the LLR of the bit of the fifth column of the data frame 64 (1.7). Accordingly, the bit of the fifth column of data frame 62 is flipped from 0 to 1. As is shown in FIG. 6A, with respect to example E, the soft read determination operation results in flipping the bit of the fifth column of data frame 64, which results in correcting the bit of the fifth column of the data frame 64 such that the flipped bit matches the originally programmed value. The page soft read/correction operation of step S420 will now be discussed in greater detail below with reference to FIG. 6B.

Figure 6B:
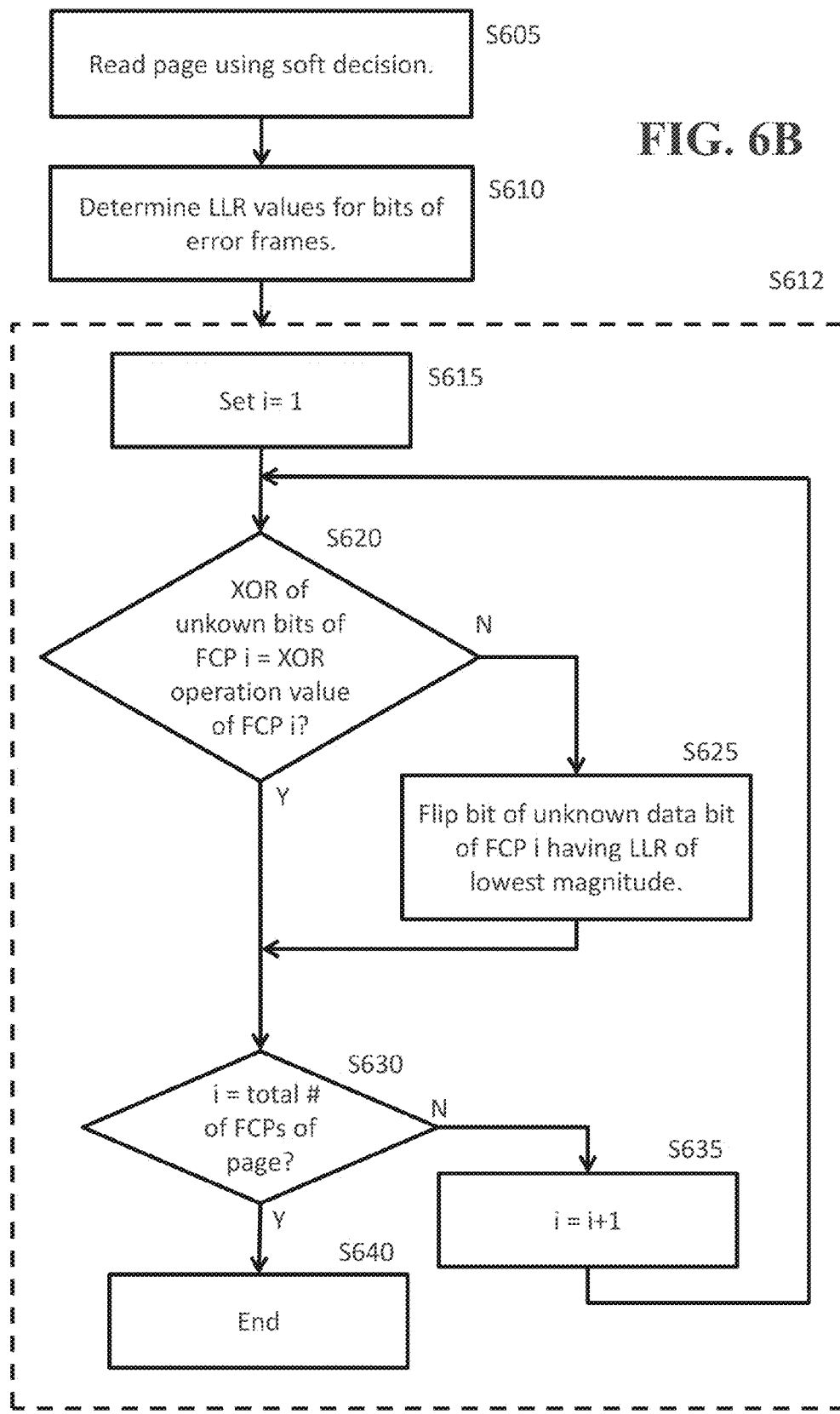
FIG. 6B is a flow chart illustrating a page soft read/decode operation according to at least one example embodiment of the inventive concepts.

FIG. 6B is a flow chart illustrating a page soft read/correction operation according to at least one example embodiment of the inventive concepts. FIG. 6B will be explained with reference to the memory page 200 illustrated in FIG. 2. As is illustrated in FIG. 6B, the page soft read/correction operation of step S420 includes a soft read operation S605, an LLR determination operation S610, and a soft correction operation S612. As will be discussed in greater detail below with reference to steps S430-S440, step S420 may be performed a plurality of times, iteratively, during a single execution of the process illustrated in FIG. 4. According to at least some example embodiments, the memory controller 1000 may perform an initial iteration of step S420 (i.e., a first iteration of step S420 performed during a single execution of the process illustrated in FIG. 4) by performing all of steps S605, S610 and S612, and the memory controller 1000 may perform each subsequent iteration of step S420 (i.e., each iteration after the initial iteration) by performing only the correction operation of step S612 (i.e., excluding performance of the soft read operation of step S605 and the LLR determination operation of step S610). Consequently, the memory controller 1000 may perform step S420 iteratively without performing a time consuming soft read operation and/or LLR determination operation each time. Alternatively, the memory controller may perform one or both of steps S605 and S610, in addition to step S612, for some or all iterations of step S420 (including iterations following the initial iteration).

Referring to FIG. 6B, in step S605 the memory controller 1000 reads the memory page 200 using a soft decision reading method. For example, the microprocessor 111 may issue read commands instructing a series of read operations for each memory cell corresponding to the memory page 200 in order to execute a soft read operation in accordance with known methods.

In step S610, the memory controller 1000 may determine LLR values for bits of error frames. For example, the microprocessor 111 may refer to the frame designation data stored, for example, in the RAM 112 during the SFHR operation discussed above with reference to FIG. 5 to determine which of the frames of the memory page 200 (i.e., the data frames 205 and the parity frame 207) are currently designated as error frames. Further, in accordance with known methods, the soft read operation of step S605 may use a plurality of different read voltages in order to generate an LLR value for each bit of each of the frames of the memory page 200. Absolute values of LLRs for a read bit may represent a level of confidence in the correctness of the read value of the bit. According to at least one example embodiment, in step S610, the memory controller 1000 calculates LLR values only for the bits of the error frames from among frames 205 and 207. Alternatively, according to at least one example embodiment, in step S610, the memory controller 1000 calculates LLR values for the bits of all the frames from among the data frames 205 and 207.

In step S612, the memory controller 1000 performs a soft correction operation. Step S612 may include steps S615-S640.

In step S615, the memory controller 1000 (e.g., the micro controller 111) sets an index value i to 1.

In step S620, the memory controller 1000 determines if the result of an XOR operation performed on unknown bits of an FCP i of the memory page 200 is equal to the XOR operation value of the FCP i. As is discussed above, unknown bits are bits of data frames that are currently designated as error frames. The microprocessor 111 can determine which data frames are error frames by, for example, consulting frame designation data stored in the RAM 112.

As is discussed above with reference to FIG. 2, bits of the data frames 205 of the memory page 200 are arranged in FCPs, and each FCP corresponds to a SPC bit stored in the party frame 207. According to at least one example embodiment, in step S620, the microprocessor 111 performs the same soft read determination operation explained above with reference to examples A-E of FIG. 6A, with the exception that the XOR operation values used in step S620 are calculated using FCPs instead of single columns. Thus, in step S620, for FCP i of the memory page 200, the memory controller 1000 (e.g., the micro controller 111) calculates the XOR operation value corresponding to the FCP i as the result of an XOR operation performed on bits of all the correct data frames for the FCP i and the SPC bit of FCP i, from among the SPC bits stored in the parity frame 207.

If, in step S620, the memory controller 1000 determines that the result of an XOR operation performed on the unknown bits of FCP i is not equal to the XOR operation value of FCP i, the memory controller 1000 proceeds to step S625.

In step S625, the memory controller 1000 flips the unknown bit of FCP i having the lowest LLR value of all the unknown bits of FCP i. For example, the microprocessor 111 may generate write commands to change the value of the unknown bit having the LLR with the lowest absolute value from among all the LLRs of all the unknown bits of FCP i from 0 to 1 or, alternatively, 1 to 0.

After step S625, the memory controller proceeds to step S630 which will be discussed in greater detail below.

Returning to step S620, if, in step S620, the memory controller 1000 determines that the result of an XOR operation performed on the unknown bits of FCP i is equal to the XOR operation value of FCP i, the memory controller proceeds to step S630.

In step S630, the memory controller 1000 (e.g., the micro controller 111) determines whether or not the index value i is equal to a total number of FCPs included in the memory page 200. If the memory controller 1000 determines the index value i is equal to a total number of FCPs included in the memory page 200, the page soft read operation ends. If the memory controller 1000 determines the index value i is not equal to a total number of FCPs included in the memory page 200, the memory controller 1000 proceeds to step S635.

In step S635, the memory controller 1000 (e.g., the micro controller 111) increments the index value i. Accordingly, the memory controller 1000 performs steps S620-S630 for each FCP in the memory page 200.

Returning to FIG. 4, after the page soft read/correction operation of step S420 is completed, the memory controller 1000 proceeds to step S425. In step S425, the memory controller performs the hard decode portion of the SFHR operation of FIG. 5 for each frame currently designated as an error frame, from among the data frames 205 and the parity frame 207. For example, the memory controller 1000 may perform step S425 to correct additional frames whose correction is made possible through the results of the page soft read/correction operation performed in step S420. As will be discussed in greater detail below with reference to steps S430-S440, step S425 may be performed iteratively. According to at least some example embodiments, the memory controller 1000 may perform each iteration of step S425 by performing only the hard decode operation portion of the SFHR operation illustrated in FIG. 5 (i.e., only step S515), without performing the hard read operation (e.g., step S510). Consequently, the memory controller 1000 may perform step S425 iteratively without performing a time consuming hard read operation each time (or, at all). Alternatively, the memory controller 1000 may perform some or all iterations of step S425 by performing both of steps S510 and S515. After step S425, the memory controller 1000 proceeds to step S430.

In step S430, the memory controller 1000 sets a value asr to the current number of error frames. The value asr represents a total number of error frames after the page soft read/correction operation of step S420. For example, in step S430, the microprocessor 111 may determine a current number of error frames of the memory page 200 by referring to frame designation data stored in the RAM 112.

In step S435, the memory controller 1000 determines whether or not the value asr is equal to 0. If, in step S435, the memory controller 1000 (e.g., the microprocessor 111) determines value asr is equal to 0, the memory controller 1000 proceeds to step S450 and determines that the page decode operation of FIG. 4 has succeeded. If, in step S435, the memory controller 1000 (e.g., the microprocessor 111) determines the value asr is not equal to 0, the memory controller 1000 proceeds to step S440.

In step S440, the memory controller 1000 determines whether or not the value asr is less than the value bsr set previously in step S415. If, in step S440, the memory controller 1000 (e.g., the microprocessor 111) determines the value asr is less than the value bsr, the memory controller 1000 returns to step S415. If, in step S440, the memory controller 1000 (e.g., the microprocessor 111) determines value asr is not less than the value bsr, the memory controller 1000 proceeds to step S445 and determines that the page decode operation of FIG. 4 has failed.

Thus, according to at least one example embodiment of the inventive concepts, the memory controller 1000 performs steps S415-S440 iteratively. Each time the page soft correction operation of step S420 (e.g., step S612) is performed, one or more bits of the memory page 200 may be changed. Further, the changed bits may allow for more frames to be successfully decoded in the hard decode operations of step S425. Thus, according to at least one example embodiment of the inventive concepts, the memory controller 1000 performs steps S415-S440 iteratively until either (i) the memory controller determines all frames of the memory page 200 have been decoded successfully or (ii) the memory controller 1000 determines that a latest iteration of performing the page soft correction operation of step S420 and performing the hard decode operations of step S425 did not result in lowering the number of error frames from among the frames of the memory page 200.

Using the encoding method of FIG. 3 and the decoding method of FIG. 4 along with the memory system 900, according to at least one example embodiment of the inventive concepts, if each cell of the page 200 of the memory cell array 2100 stores 3 bits, a total redundancy of the memory page 200 may be ~11%. For example, a length of the data bits 210 of one of the data frames 205 may be, for example, 1821 bits. Further, a length of the data bits 210 combined with the redundancy bits 215 of one of the data frames 205 may be, for example, 1986 bits. The correction capability of such a 1986 bit data frame may be, for example, 15 errors. Accordingly, a BCH redundancy rate of one of the data frames 205 may be 9.06%. Further, the page 200 may include, for example, 36 total data frames 205 and 0.5 frames for use as the parity frame 207 (i.e., the parity frame 207 is half the size of one of the data frames 205). Accordingly, the parity redundancy rate of the memory page 200 may be, for example, 1.75%, and the total redundancy of the memory page 200 may be, for example, 10.94%.

When BCH codes are used by the decoder 1200 and encoder 1100 of the memory system 900 to implement the encoding method of FIG. 3 and the decoding method of FIG. 4, hardware (HW) complexity (e.g., the HW complexity of the memory controller 1000) may be very small in comparison to the HW complexity of a memory controller that uses LDPC codes for encoding and decoding since the basic BCH code word length (e.g., ~2000) and correction capability (t) (e.g., ~15 errors) may be relatively small compared to conventional BCH codes.

Further, the memory system 900 implementing the encoding method of FIG. 3 and the decoding method of FIG. 4 may achieve a BER coverage that exceeds 1K LDPC code performance, and achieves high throughput performance due to low soft decision probability. According to at least one example embodiment, BER coverage may by enhanced even more by using projected error correcting codes (ECC).

Figure 7A:
FIG. 7A is a diagram showing a structure of a memory page for use with projected error correcting codes (ECC) according to at least one example embodiment of the inventive concepts.

FIG. 7A is a diagram showing a structure of a memory page for use with projected ECC according to at least one example embodiment of the inventive concepts.

FIG. 7A illustrates the memory page 200. The memory page 200 illustrated in FIG. 7A may include the same structure as the memory page 200 of FIG. 2. Further, as is illustrated in FIG. 7A, the data frames 205 of the memory page 200 may be divided into a plurality of random access units (RAUs) including a first RAU 712 and a second RAU 714. Additionally, as is shown in FIG. 7A, each of the first and second RAUs may be associated with a projected overhead. For example, the first RAU 712 is associated with the first projected overhead 722, and the second RAU 714 is associated with the second projected overhead 724. As is discussed above with respect to FIG. 2, according to at least one example embodiment, a total size of the memory page 200 may be ~8 KB, a size of each frame among the data frames 205 may be ~2000 bits, and a size of the parity frame 207 may be ~1000 bits. Further, a total size of each of the first and second RAUs 722 and 724 may be ~4 KB when, as is shown in FIG. 7A, the data frames 205 of the memory page 200 are divided into two RAUs.

As will be discussed in greater detail below, the projected overheads 722 and 724 each include data that can be used by the decoder 1200 to obtain redundancy data in addition to the redundancy data of the redundancy bits 215. The additional redundancy data, referred to herein as delta syndromes, obtained through the projected overheads 722 and 724 may be used by the memory controller 1000 to increase the error correction capability already provided by the redundancy bits 215 for each of the data frames 205. The above-referenced delta syndromes will now be discussed in greater detail below.

According to at least one example embodiment, first and second projected overheads 722 and 724 may be, for example, examples of the concept of projected BCH. The concept of projected BCH includes exploiting the knowledge of the probability of a large number of errors existing in a few frames in a memory page (e.g., the memory page 200) being relatively high, while the probability of a large number of errors existing in a large number of frames of the memory page is relatively low. Given this behavior, projected BCH enables variable protection for different numbers of failed words (e.g., strongest protection for a single failed word and weakest protection for all failed words in the memory page).

Projected BCH is achieved by extending the basic BCH code correction capability from $t_0$ errors to $t_i = t_0 + \Delta t_i$ errors, where 'i' is the projected page stage index, $t_0$ is an initial error correction capability of the reliability bits 215 of a data frame from among the data frames 205, and $\Delta t_i$ is the change in correction capability relative to $t_0$.

For example, a word (i.e., series of data bits) received at a receiver (e.g., decoder 1200) may be represented as $y = c + e$, where c is a code word, e is an errors sequence, $c \in C$, $C \subseteq F_2^n$, $n = 2^m - 1$, C is a primitive BCH code with a correction capability of $t_0$ errors, n is a code length of the code word c, and m is a positive integer.

Further, the receiver can decode the transmitted code word from the syndrome of the error sequence $S_e^{t_0}$ as is described below. Since, $S_y^{t_0} = H^{t_0} \cdot y = H^{t_0} \cdot (c+e) = H^{t_0} \cdot e$, $S_e^{t_0}$ can be computed as $H^{t_0} \cdot y$ in accordance with Equation (1):

$$S_e^{t_0} = H^{t_0} \cdot e = H^{t_0} \cdot y = \begin{pmatrix} 1 & \alpha & \ldots & \alpha^{n-1} \\ \vdots & \alpha^3 & \ddots & \vdots \\ 1 & \alpha^{2t_0-1} & \ldots & \alpha^{(2t_0-1)(n-1)} \end{pmatrix} \cdot y. \quad (1)$$

In order to extend the error correction capability to $t_i = t_0 + \Delta t_i$, the receiver should have the extended error syndrome expressed by Equation (2) below:

$$S_e^{t_i} = \qquad (2)$$

$$H^{t_i} \cdot e = \begin{pmatrix} 1 & \alpha & \ldots & \alpha^{n-1} \\ \vdots & \alpha^3 & \ldots & \vdots \\ 1 & \alpha^{2t_0-1} & \ldots & \alpha^{(2t_0-1)(n-1)} \\ 1 & \alpha^{2t_0+1} & \ldots & \alpha^{(2t_0+1)(n-1)} \\ \vdots & \alpha^{2t_0+3} & \ldots & \vdots \\ 1 & \alpha^{2t_i-1} & \ldots & \alpha^{(2t_i-1)(n-1)} \end{pmatrix} \cdot e = \begin{pmatrix} H^{t_0} \\ \Delta H^{t_i} \end{pmatrix} \cdot e = \begin{pmatrix} H^{t_0} \cdot e \\ \Delta H^{t_i} \cdot e \end{pmatrix}.$$

The receiver can compute $S_y^{t_i}$ according to Equation (3) below:

$$S_y^{t_i} = H^{t_i} \cdot y = H^{t_i} \cdot (c+e) = \begin{pmatrix} H^{t_0} \cdot (c+e) \\ \Delta H^{t_i} \cdot (c+e) \end{pmatrix} = \begin{pmatrix} H^{t_0} \cdot e \\ \Delta H^{t_i} \cdot (c+e) \end{pmatrix}. \quad (3)$$

Accordingly, if the receiver has inside information $\Delta H^{t_i} \cdot c \equiv S_c^{\Delta t_i}$, the receiver can evaluate the extended error syndrome defined by Equation (4) below:

$$S_e^{t_i} = \begin{pmatrix} S_e^{t_0} \\ S_y^{\Delta t_i} - S_c^{\Delta t_i} \end{pmatrix} = \begin{pmatrix} S_e^{t_0} \\ S_e^{\Delta t_i} \end{pmatrix}. \quad (4)$$

This side information ("delta" syndrome of the code word c, $S_c^{\Delta t_i}$) is saved as the projected BCH redundancy.

Accordingly, the delta syndrome of a code word c, $S_c^{\Delta t_i}$, is defined according to Equation (5) below:

$$S_c^{\Delta t_i} = \begin{pmatrix} 1 & \alpha^{2t_0+1} & \ldots & \alpha^{(2t_0+1)(n-1)} \\ \vdots & \vdots & \ldots & \vdots \\ 1 & \alpha^{2t_i-1} & \ldots & \alpha^{(2t_i-1)(n-1)} \end{pmatrix} \cdot c = \begin{pmatrix} c(\alpha^{2t_0+1}) \\ \vdots \\ c(\alpha^{2t_i+1}) \end{pmatrix} = \begin{pmatrix} \alpha^{j1} \\ \vdots \\ \alpha^{j\Delta t_i} \end{pmatrix}, \quad (5)$$

where $0 \leq j < 2^m - 2$.

According to at least one example embodiment, $m \ast \Delta t_i$ bits may be required to store to store the above-referenced delta syndrome of a code word c, $S_c^{\Delta t_i}$.

If projected BCH is used to support a failure of only one of the data frames in an RAU of the memory page 200, a delta syndrome $S_c^{\Delta t_i}$ is computed for each one of the data frames 205, but only the result of an XOR operation performed on each of the computed delta syndromes $S_c^{\Delta t_i}$ is stored as a delta syndrome XOR value.

Accordingly, when there is only one error frame in an RAU of the memory page 200, the delta syndromes $S_c^{\Delta t_i}$ of the correct frames can be calculated in accordance with equations (1)-(5) above, and the delta syndrome $S_c^{\Delta t_i}$ of the error frame can be reconstructed by determining the result of an XOR operation performed on the calculated delta syndromes $S_c^{\Delta t_i}$ of the correct frames and the above-referenced delta syndrome XOR value. Once the delta syndrome $S_c^{\Delta t_i}$ of the error frame is reconstructed, the correction capability of the error frame is increased from $t_0$ to $t_i = t_0 + \Delta t_i$.

Figure 7B:
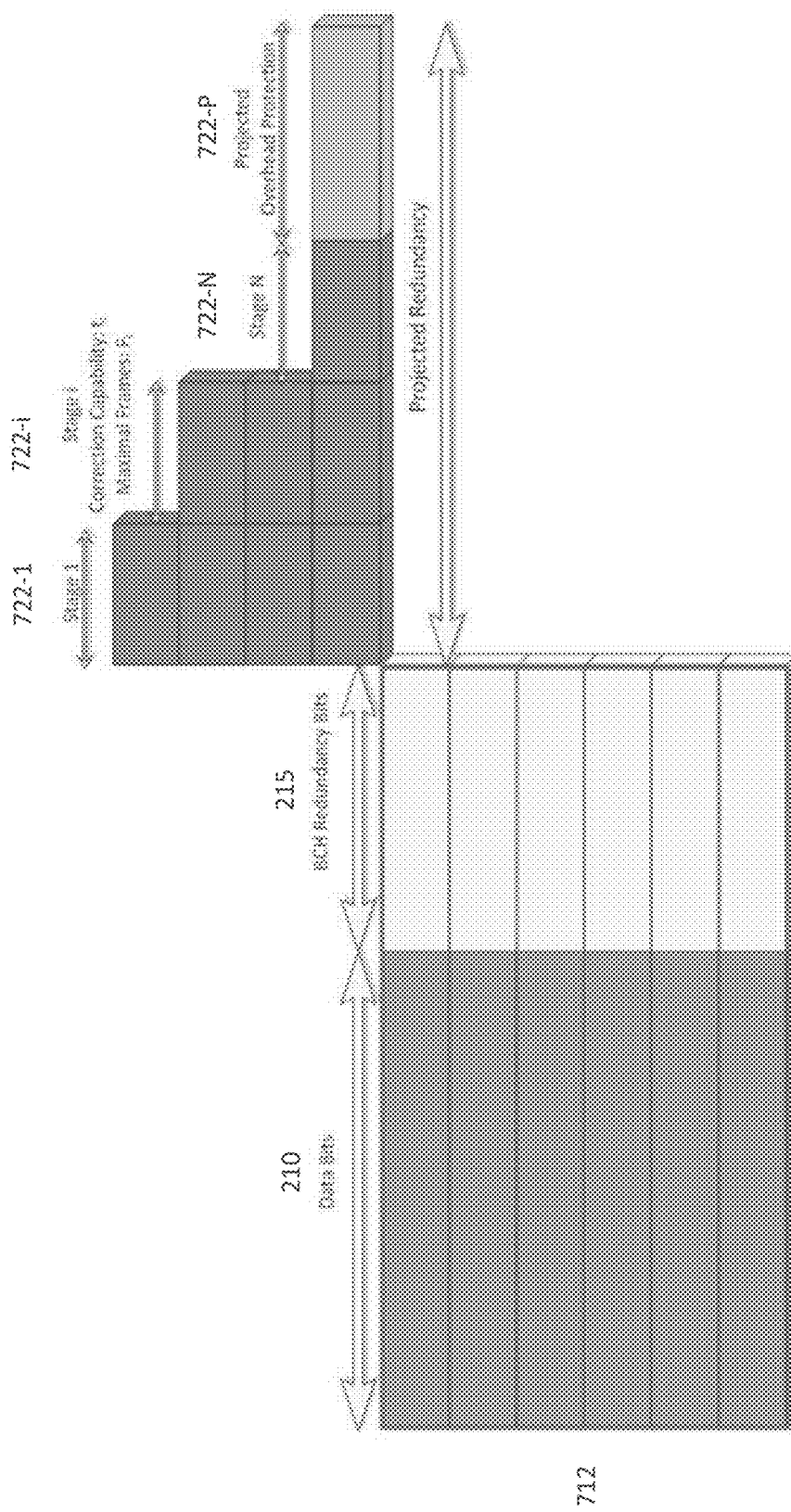
FIG. 7B is a diagram for explaining a projected overhead generated using projected ECC according to at least one example embodiment of the inventive concepts.

If projected BCH is used to support a failure of multiple data frames in an RAU of the memory page 200, a delta syndrome $S_c^{\Delta t_i}$ is computed for each one of the data frames 205, different stages (i.e., different values for i) among the delta syndromes $S_c^{\Delta t_i}$ are encoded using, for example, RS code, and the redundancy data of the resulting RS code is stored as is shown, for example, in FIG. 7B.

FIG. 7B is a diagram for explaining a projected overhead generated using projected ECC according to at least one example embodiment of the inventive concepts. For example, FIG. 7B illustrates first projected overhead 722 which includes first redundancy data 722-1. First redundancy data 722-1 is the redundancy data from an RS code word formed by performing RS encoding on $1^{st}$ stage delta syndrome data of the delta syndromes $S_c^{\Delta t_i}$ of each of the data frames of the first RAU 712 of the memory page 200, as will be explained in greater detail below with reference to FIG. 8. As is illustrated in FIG. 7B, if the delta syndromes $S_c^{\Delta t_i}$ include N stages of delta syndrome data, the first projected overhead 722 may include first through Nth redundancy data 722-1 through 722-N.

FIG. 8 is a flow chart illustrating a projected ECC encoding method according to at least one example embodiment of the inventive concepts. According to at least one example embodiment, the method illustrated in FIG. 8 may be performed, for example, by the memory controller 1000 illustrated in FIG. 1. According to at least one example embodiment, the steps illustrated in FIG. 8 are performed in addition to (i.e., after) the data encoding steps S310 to S360 illustrated in FIG. 3, in which data bits are encoded by the memory controller 1000 and stored as the page 200 within the memory cell array 2100. Accordingly, FIG. 8 is explained below with reference to a scenario in which steps S310 to S360 have already been performed.

Referring to FIG. 8, in step S805, the memory controller 1000 sets an index value n to 1. For example, the microprocessor 111 may store the index value n in the RAM 112 in step S805.

In step S810, the memory controller 1000 generates N stages of delta syndrome data for data bits 210 of each data frame of RAU n, where N is a positive integer representing a total number of stages of the delta syndrome data of the RAUs of the memory page 200. According to at least one example embodiment, the projected ECC decoding method of FIG. 8 uses projected BCH. For example, when n=1, in step S810, the microprocessor 111 may control the encoder 1100 to generate, for each data frame of RAU 1 (i.e., the first RAU 722) delta syndrome $S_c^{\Delta t_i}$ for i=1, 2, 3, . . . N (e.g., $S_c^{\Delta t_1}$, $S_c^{\Delta t_2}$, $S_c^{\Delta t_3}$ . . . $S_c^{\Delta t_N}$), in accordance with equations (1)-(5) discussed above. As is discussed above with reference to equations (1)-(5), $\Delta t_i$ represents an added BCH correction capability provided by a delta syndrome $S_c^{\Delta t_i}$ for a particular data frame with reference to an initial correction capability $t_0$.

In step S815, the memory controller 1000 sets an index value i to 1. For example, the microprocessor 111 may store the index value i in the RAM 112 in step S815.

In step S820, the memory controller 1000 may generate a stage i code word for RAU n by encoding stage i delta syndromes for all the data frames of RAU n. For example, when n=1 and i=1, in step S820 the microprocessor 111 may control the encoder 1100 to generate a stage 1 code word for RAU 1 (i.e., the first RAU 722) by performing RS encoding on the stage 1 delta syndromes $S_c^{\Delta t_1}$ of each data frame in the first RAU 722. Accordingly, in step S820, the stage 1 delta syndromes $S_c^{\Delta t_1}$ of each data frame in the first RAU 722 may be combined, for example under the control of the microprocessor 111, and the combined data is encoded by the encoder 1100 using RS code to generate a single stage 1 code word for RAU 1. For example, in FIG. 7B six data frames of the first RAU 722 are illustrated. If the first RAU 722 has a total of six data frames, then, in step S820, six stage 1 delta syndromes $S_c^{\Delta t_1}$ are combined, for example under the control of the microprocessor 111, and the encoder 1100 encodes the combined six stage 1 delta syndromes using RS code to generate a single stage 1 code word for the first RAU 722.

Because the stage i code word generated in step S820 is an RS code word, the stage i code word will include data bits and redundancy bits.

In step S825, the memory controller 1000 may compare the index value i to the value N. For example, step S825, may be used to determine whether or not stage code words have been generated for all stages i=1, 2, 3, . . . N. If, in step S825, the memory controller 1000 (e.g., the microprocessor 111) determines that i is not equal to N, the memory controller 1000 proceeds to step S830. In step S830, the memory controller 1000 increments the index value i and repeats step S820 for the new value i. If, in step S825, the memory controller 1000 (e.g., the microprocessor 111) determines that i is not equal to N, the memory controller 1000 proceeds to step S835. Accordingly, step S820 is repeated iteratively such that N stage code words (e.g., a stage 1 code word, a stage 2 code word, and a stage N code word) are generated corresponding, respectively, to delta syndromes delta syndrome $S_c^{\Delta t_i}$ for i=1, 2, 3, . . . , N.

Further, a correction capability of the stage i code word may be controlled by controlling the number of redundancy bits generated for the stage i code word. For example, as is known, an error correction capability of an RS code word in terms of bits may be equal to half the number of redundancy bits included in the RS code word. Further, the code words of different stages i generated in different iterations of step S820 may be generated to have different error correction capabilities. For example, Table 1 below shows an example of five different stages 1-5 of RS code words each having different example error correction capabilities. As a point of reference, Table 1 also shows an example of the original error correction capabilities (i.e., $t_0$) of the redundancy bits 215 of a data frame.

TABLE 1

| Stage Index | $t_i$ (bits) | Maximal correctable Failures (frames) |
| --- | --- | --- |
| 0 | 13 | 18 |
| 1 | 14 | 5 |
| 2 | 16 | 4 |
| 3 | 17 | 3 |
| 4 | 21 | 2 |
| 5 | 29 | 1 |

For example, in the example illustrated above in Table 1, for index value 0, corresponding to initial error correction capability $t_0$, the initial error correction capability $t_0$ of the data frames 205 is 13 bits per data frame, and the total number of error frames that may be corrected is 18 (i.e., all the data frames in one RAU of the memory page 200 if the memory page 200 includes 36 frames total divided evenly into two RAUs).

As another example, for index value 1 shown in Table 1, a total error correction capability $t_1$ of the stage 1 delta syndrome data generated in step S810 is 14 bits per data frame, the added correction capability $\Delta t_1$ is 1 bit per data frame, and the corresponding stage 1 code word generated in step S820 may be an RS code word having a number of redundancy bits that allows the reconstruction of the stage 1 delta syndrome data of a maximum of 5 error frames from among the data frames of an RAU of the memory page 200.

As another example, for index value 2 shown in Table 1, a total error correction capability $t_2$ of the stage 2 delta syndrome data generated in step S810 is 16 bits per data frame, the added correction capability $\Delta t_2$ is 3 bits per data frame, and the corresponding stage 2 code word generated in step S820 may be an RS code word having a number of redundancy bits that allows the reconstruction of the stage 2 delta syndrome data of a maximum of 4 error frames from among the data frames of an RAU of the memory page 200.

As another example, for index value 3 shown in Table 1, a total error correction capability $t_3$ of the stage 3 delta syndrome data generated in step S810 is 17 bits per data frame, the added correction capability $\Delta t_3$ is 4 bits per data frame, and the corresponding stage 3 code word generated in step S820 may be an RS code word having a number of redundancy bits that allows the reconstruction of the stage 3 delta syndrome data of a maximum of 3 error frames from among the data frames of an RAU of the memory page 200.

As another example, for index value 4 shown in Table 1, a total error correction capability $t_4$ of the stage 4 delta syndrome data generated in step S810 is 21 bits per data frame, the added correction capability $\Delta t_4$ is 8 bits per data frame, and the corresponding stage 4 code word generated in step S820 may be an RS code word having a number of redundancy bits that allows the reconstruction of the stage 4 delta syndrome data of a maximum of 2 error frames from among the data frames of an RAU of the memory page 200.

As another example, for index value 5 shown in Table 1, a total error correction capability $t_5$ of the stage 5 delta syndrome data generated in step S810 is 29 bits per data frame, the added correction capability $\Delta t_5$ is 16 bits per data frame, and the corresponding stage 5 code word generated in step S820 may be an RS code word having a number of redundancy bits that allow the reconstruction of the stage 5 delta syndrome data of a maximum of 1 error frame from among the data frames of an RAU of the memory page 200.

Accordingly, as is shown in Table 1, as the error correction capabilities $\Delta t_i$ of the delta syndrome stages increase, the RS code words formed based on the delta syndrome stages are formed such that the maximum number of error frames for which delta syndrome data can be reconstructed decreases. For example, delta syndrome stages with relatively low error correction capabilities $\Delta t_i$ are encoded into code words which can reconstruct the delta syndrome data of a relatively high number of error frames, whereas delta syndrome stages with relatively high error correction capabilities $\Delta t_i$ are encoded into code words which can reconstruct the delta syndrome data of a relatively low number of error frames.

In step S835, the memory controller 1000 (e.g., the encoder 1100) encodes the redundancy data generated for RAU n throughout iterations 1 through N of step S820 as projected overhead protection code word n. For example the first projected overhead protection code word 722-P (i.e., projected overhead protection code word 1), which corresponds to the first RAU 722, is illustrated in FIG. 7B. In step S835, the memory controller 1000 may store the projected overhead protection code word n, for example, in the memory page 200.

In step S840, the memory controller 1000 (e.g., the microprocessor 111) determines if the index value n is equal to a total number of RAUs in the memory page 200. For example, the total number of RAUs of the memory page 200 may be stored in the RAM 112 or supplied to the microprocessor 111 from an external source. If, in step S840, the memory controller 1000 determines that the index value n does not equal a total number of RAUs of the memory page 200, the memory controller 1000 increments the index value n in step S845, and performs steps S810 to S840 for RAU n with respect to the incremented value of n. If, in step S840, the memory controller 1000 determines that the index value n does equal a total number of RAUs of the memory page 200, the memory controller 1000 proceeds to step S850 an ends the encoding operation.

A decoding method using projected ECC will now be discussed with reference to FIG. 9.

Figure 9:
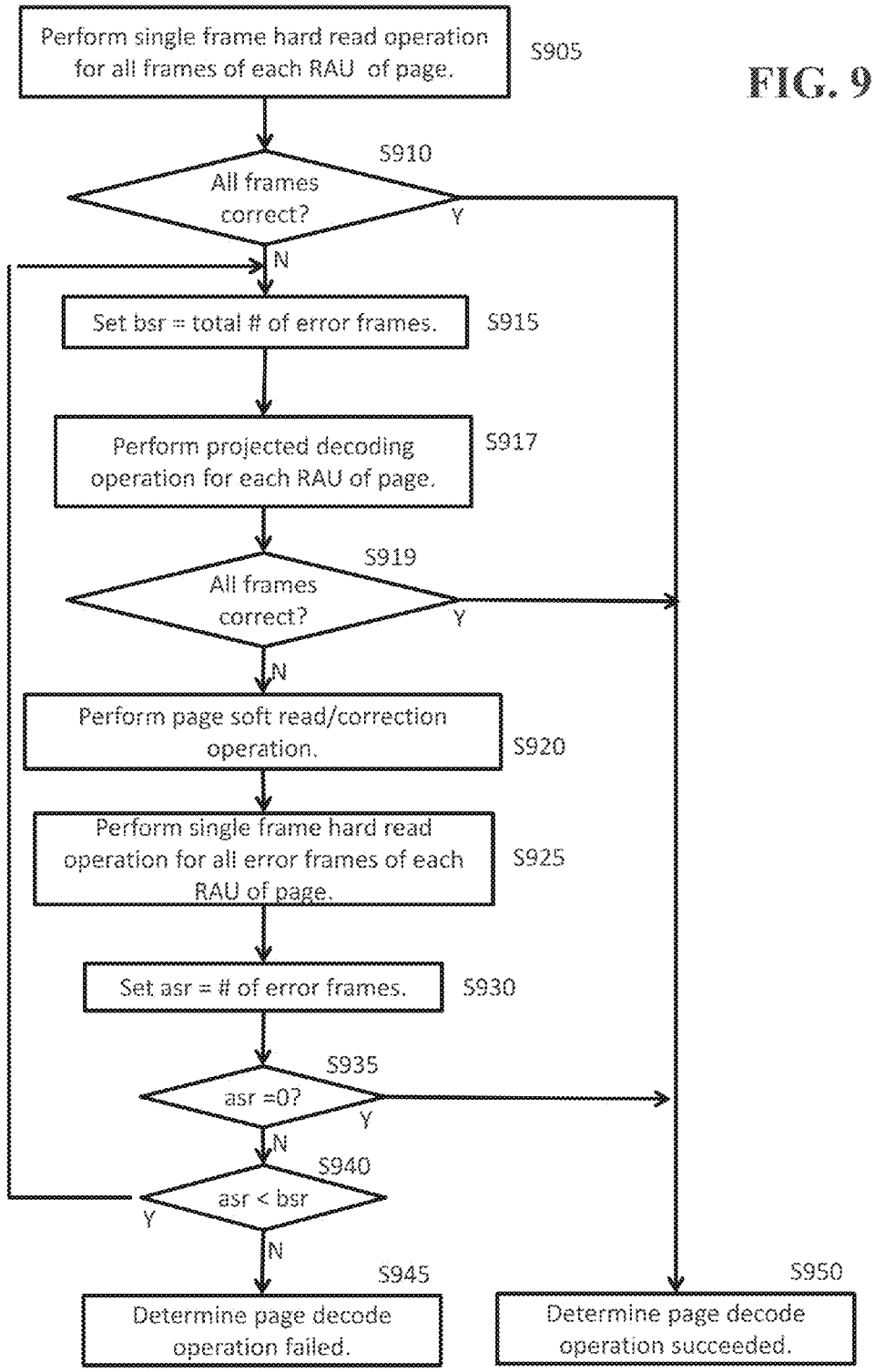
FIG. 9 is a flow chart illustrating a decoding method that includes a projected ECC decoding operation according to at least one example embodiment of the inventive concepts.

FIG. 9 is a flow chart illustrating a decoding method that includes a projected ECC decoding operation according to at least one example embodiment of the inventive concepts. According to at least one example embodiment, the method illustrated in FIG. 9 may be performed, for example, by the memory controller 1000 illustrated in FIG. 1. For the purpose of clarity, FIG. 9 will be explained, in part, by referencing FIG. 10.

Further, FIGS. 9 and 10 will be explained with reference to an example where data bits are read by the memory controller 1000 from the memory page 200 within the memory cell array 2100, and decoded by the memory controller 1000.

Referring to FIG. 9, in step S905, the memory controller 1000 performs the SFHR operation illustrated in FIG. 5 for each frame of each RAU read from the memory page 200. As is discussed above with reference to FIG. 5, the memory controller 1000 may store, for example in RAM 112, frame designation data indicating whether each data frame 205 is an error frame or a correct frame.

In step S910, the memory controller 1000 determines whether or not all the frames of the memory page 200 are designated as correct frames. For example, in Step S910, the microprocessor 111 may check the frame designation data stored in the RAM 112 during the SFHR operations performed in step S905 to determine whether or not all the data frames 205 of the memory page 200 are designated as correct frames.

If, in step S910, the memory controller 1000 determines that all the data frames 205 of the memory page 200 are designated as correct frames, the memory controller proceeds to step S950. In step S950, the memory controller 1000 determines the data decoding operation of FIG. 9 succeeded in decoding the memory page 200, and the data decoding operation ends for the memory page 200.

If, in step S910, the memory controller 1000 determines that not all of the data frames 205 of the memory page 200 are designated as correct frames, the memory controller 1000 initiates a recursive data decoding routine including steps S915-S940.

In step S915, the memory controller 1000 sets a data value bsr to a total number of error frames. The value bsr represent a total number of error frames of the memory page 200 before the page soft read/correction operation of step S920 is performed. For example, according to at least one example embodiment, in step S915, the microprocessor 111 may check the frame designation data stored in the RAM 112 to determine the total number of data frames 205 of the memory page 200 that are currently designated as error frames, and the microprocessor 111 may store the determined total number of error frames as the data value bsr in the RAM 112.

In step S917, the memory controller 1000 performs a projected ECC decoding operation for each RAU of the memory page 200. An example of the projected decoding operation is illustrated in FIG. 10.

Figure 10:
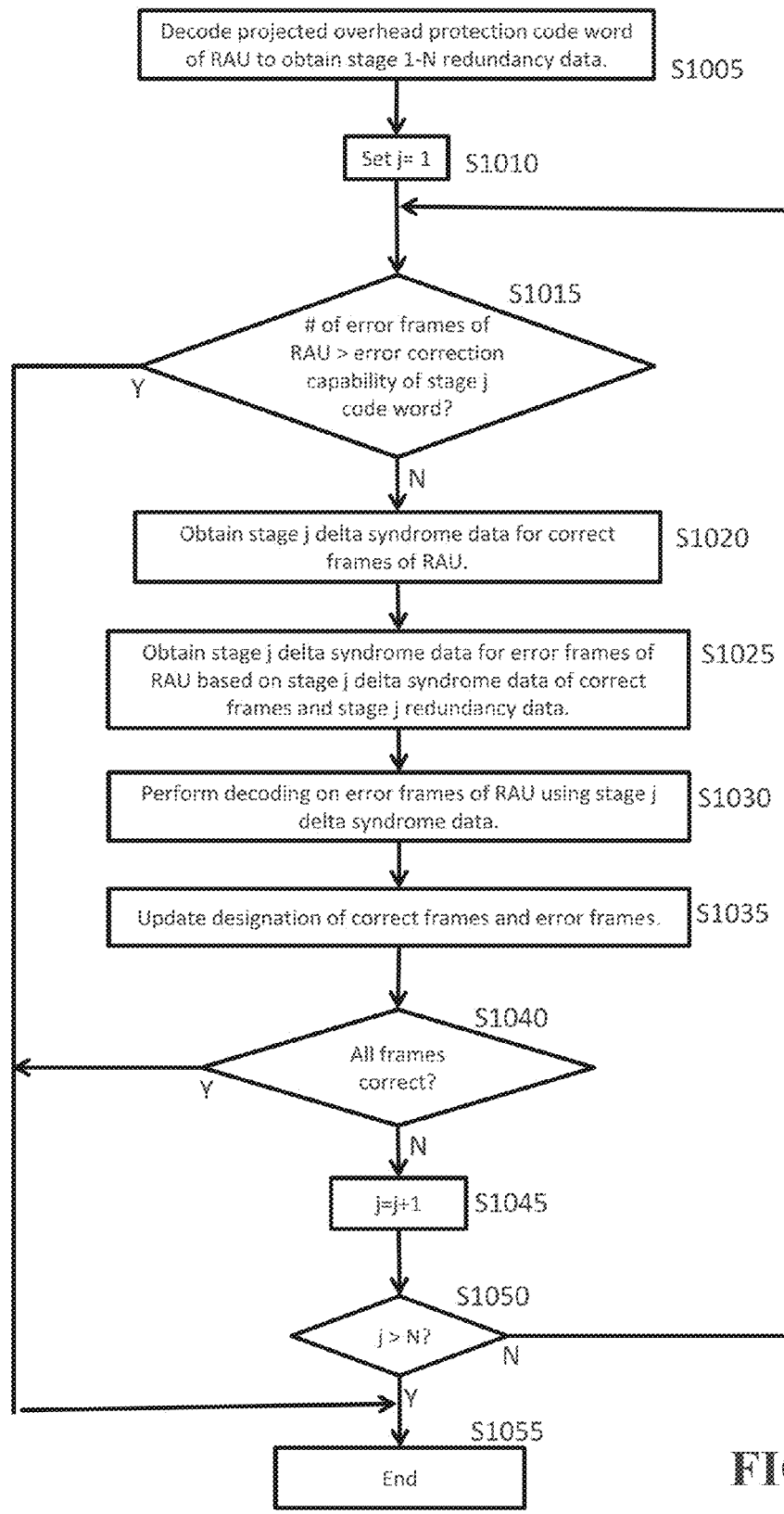
FIG. 10 is a flow chart illustrating a projected ECC decoding operation according to at least one example embodiment of the inventive concepts.

FIG. 10 is a flow chart illustrating a projected ECC decoding operation according to at least one example embodiment of the inventive concepts. As an example, FIG. 10 will be explained with reference to the first RAU 722.

However, as part of step S917, the method illustrated in FIG. 10 is performed with respect to every RAU in the memory page being decoded by the page decoding method of FIG. 9. Accordingly the operations of FIG. 10 discussed below with reference to the first RAU 722, may be performed with respect to every RAU of the memory page 200.

Referring to FIG. 10, in step S1005, the memory controller 1000 decodes the projected overhead protection code word corresponding to the first RAU 722 to obtain stage 1 through stage N redundancy data. For example, as is discussed above with reference to FIG. 8, in accordance with step S835, the memory controller 1000 generates a projected overhead protection code word for each RAU n of the memory page 200, and stores the projected overhead protection code words (e.g., in the memory page 200 or another portion of the memory device 2000). Accordingly, the projected overhead protection code word of the first RAU 722 decoded, for example by the decoder 1200, in step S1005 may be a projected overhead protection code word crated, for example by the encoder 1100, in step S835.

By decoding the projected overhead protection code word for the first RAU 722 in step S1005, the memory controller 1000 obtains the redundancy data (e.g., redundancy bits) of stage 1-stage N code words that were generated by performing RS encoding operations, respectively, on stage 1-stage N delta syndrome data of the data frames of the first RAU 722.

In step S1010, the memory controller 1000 sets an index value j to 1.

In step S1015, the memory controller 1000 (e.g., the microprocessor 111) determines if a current number of error frames of the first RAU 722 is greater than an error correction capability of the stage j code word. For example, using Table 1 as an example, when j=1, the stage 1 code word is capable of reconstructing the stage 1 delta syndrome data (e.g., the stage 1 delta syndromes $S_c^{\Delta t_1}$) for up to 5 error frames. Accordingly, if a total number of error frames from among the data frames of the first RAU 722 is greater than 5, the memory controller 1000 is not able to reconstruct the stage 1 delta syndrome data of each of the error frames of the first RAU 722. Further, if a total number of error frames form among the data frames of the first RAU 722 is not greater than 5, the memory controller 1000 is able to reconstruct the stage 1 delta syndrome data of each of the error frames of the first RAU 722.

Accordingly, if in step S1015 the memory controller 1000 (e.g., the microprocessor 111) determines if a current number of error frames of the first RAU 722 is greater than an error correction capability of the stage j code word, the memory controller 1000 proceeds to step S1055 and the projected ECC decoding operation of FIG. 10 ends. Further, if in step S1015 the memory controller 1000 (e.g., the microprocessor 111) determines if a current number of error frames of the first RAU 722 is not greater than an error correction capability of the stage j code word, the memory controller proceeds to step S1020. For example, in Step S1015, the microprocessor 111 may check the frame designation data stored in the RAM 112 to determine a total number of error frames from among data frames of the first RAU 722.

In step S1020, the memory controller 1000 obtains the stage j delta syndrome data for the correct frames of the first RAU 722. For example, for every correct data frame of the first RAU 722, the stage j delta syndrome data (e.g., the stage 1 delta syndromes $S_c^{\Delta t_1}$ when j=1) can be calculated for each correct frame using, for example, equations (1)-(5) discussed above. For example, if the first RAU 722 includes a total of 18 data frames 205, and 13 of the 18 data frames are currently designated as correct data frames, then stage j delta syndrome data may be generated for each one of the 13 correct data frames of the first RAU 722.

In step S1025, the memory controller 1000 obtains stage j delta syndrome data for error frames of the first RAU based on the stage j delta syndrome data of the correct frames obtained in step S1020 and the stage j redundancy data obtained in step S1005.

For example, as is discussed above, the stage 1 code word described in Table 1 is capable of reconstructing the stage 1 delta syndrome data of up to 5 error frames. Further, because, as is also discussed above, 13 out of 18 data frames of the first RAU 722 are correct frames, only 5 data frames of the first RAU 722 are error frames. Accordingly, by combining the stage 1 delta syndrome data of the 13 correct frames with the redundancy bits of the stage j code word obtained in step S1005, the memory controller 1000 (e.g., the decoder 1200) may reconstruct the missing bits of the full stage j code word corresponding to the 5 error frames using known RS decoding procedures. After step S1025, the memory controller proceeds to step S1030.

In step S1030, the memory controller 1000 (e.g., the decoder 1200) performs decoding on the error frames of the first RAU 722 using the fully reconstructed stage j delta syndrome data obtained in step S1025. For example, once the full stage j code word is reconstructed in step S1025, in step s1030, the decoder 1200 may use the reconstructed stage j delta syndrome data to increase the error correction capability of the redundancy bits 215 of each of the 5 error frames by $\Delta t_1$ bits. As is described above with respect to Table 1, $\Delta t_1$=1 and a total error correction capability $t_1$=14 bits. Accordingly, for each of the 5 error frames having a total number of errors equal to, or less than, 14 bits, the decoder 1200 can successfully decode the error frame and reduce the total number or error frames.

In step S1035, the memory controller 1000 updates the designation of correct frames and error frames. For example, if the memory controller (e.g., the decoder 1200) is successful in decoding one or more of the 5 error frames in step S1030, the microcontroller may change the frame designation information stored in the RAM 112 to change designations of the one or more error frames corrected in step S1030 from error frame to correct frames.

In step S1040, the memory controller 1000 (e.g., the microprocessor 111) determines if all data frames of the first RAU 722 are correct. For example, the microprocessor 111 can check the frame designation data stored in the RAM 112 to determine if all the frames of the first RAU 722 are designated as correct frames.

If, in step S1040, the memory controller 1000 determines that all the data frames of the first RAU are correct, the memory controller 1000 proceeds to step S1055 and the projected ECC decoding operation of FIG. 10 ends. If, in step S1040, the memory controller 1000 determines that not all the data frames of the first RAU are correct, the memory controller 1000 proceeds to step S1045.

In step S1045, the index value j is incremented by 1 by the memory controller 1000. For example, the microprocessor 111 may increment the index value j in step S1045.

In step S1050, the memory controller 1000 (e.g., the microprocessor 111) determines if the index value j is greater than the value N, where N is the total number of stages of delta syndrome data corresponding to the data frames of the first RAU 722. In the example shown in Table 1 above, the total number of stages of delta syndrome data is 5, and thus, N=5.

If, in step S1050, the memory controller 1000 determines that the index value j is not greater than the value N, the memory controller 1000 returns to step S1015 and performs steps S1015-S1045 with respect to the newly incremented index value j. If, in step S1050, the memory controller 1000 determines that the index value j is greater than the value N, the memory controller 1000 proceeds to step S1055 and the projected ECC decoding operation of FIG. 10 ends.

Further, according to at least some example embodiments, it is possible for the memory controller to address MC frames using the process illustrated in FIG. 10. As used herein, the term "MC frame" refers to a miss-corrected frame, which is an error frame that was erroneously designated as a correct frame during BCH decoding (e.g., during step S530 illustrated in FIG. 5). An MC syndrome is a syndrome generated (e.g., in step S1020) based on an MC frame. When an MC frame exists, because the MC frame is an error frame, the MC syndrome generated based on the MC frame (i.e., step S1020 in FIG. 10) will also be erroneous. However, as long as the total number of erroneous stage j syndromes (i.e., number of stage j syndromes of known error frames+(2×number of stage j MC syndromes)) is equal to or below the maximum error correcting capability of the stage j syndrome code word, the memory controller 1000 (e.g., the decoder 1200) can use the stage j syndrome code word to correct all erroneous stage j syndromes (i.e., including one or more erroneous stage j MC syndromes), for example, in the same manner discussed above with respect to step S1025. Further, the memory controller 1000 (e.g., the decoder 1200) is capable of identifying MC syndromes. For example, the memory controller 1000 is capable of determining when a stage j syndrome that is corrected in step S1025 is an MC syndrome, because MC syndromes are generated based on frames that are identified (e.g., in the frame designation data stored in the RAM 112) as a correct frames. Thus, the memory controller 1000 may identify, as MC syndromes, syndromes that memory controller 1000 detects as being both (i) corrected in step S1025 and (ii) generated based on a frame identified (e.g., in the frame designation data stored in the RAM 112) as a correct frame. Further, the decoder 1200 is capable of signaling, for example, the microprocessor 111 when an MC syndrome is detected. The signaling may include identification of the MC frame corresponding to the MC syndrome. Based on the notification generated by the decoder 1200, the memory controller 1000 (e.g., the microprocessor 111) may designate the MC frame as an error frame (e.g., by updating the frame designation data stored in the RAM 112) and perform an additional BCH decoding operation on the MC frame using the newly corrected stage j syndrome data corresponding to the MC frame.

Returning to FIG. 9, after step S917 is complete, the memory controller 1000 proceeds to step S919. In step S919, the memory controller 1000 determines whether or not all data frames of each of the RAUs of the memory page 200 are correct. For example, in step S919, the microprocessor 111 may check the frame designation data stored in the RAM 112 to determine whether or not all data frames of each of the RAUs of the memory page 200 are correct.

If, in step S919, the memory controller 1000 determines all data frames of each of the RAUs of the memory page 200 are correct, the memory controller proceeds to step S950 and determines that the page decoding method of FIG. 9 succeeded in decoding the memory page 200. If, in step S919, the memory controller 1000 determines that not all data frames of each of the RAUs of the memory page 200 are correct, the memory controller proceeds to step S920.

In step S920, the memory controller 1000 performs a page soft read/correction operation. The memory controller 1000 may perform the page soft read/correction operation on the memory page 200 in step S920 in the same manner discussed above for step S420 with reference to FIGS. 6A and 6B. As will be discussed in greater detail below with reference to steps S930-S940, step S920 may be performed a plurality of times, iteratively, during a single execution of the process illustrated in FIG. 9. According to at least some example embodiments, the memory controller 1000 may perform an initial iteration of step S920 (i.e., a first iteration of step S920 performed during a single execution of the process illustrated in FIG. 9) by performing all of steps S605, S610 and S612 illustrated in FIG. 6B, and the memory controller 1000 may perform each subsequent iteration of step S920 (i.e., each iteration after the initial iteration) by performing only the correction operation of step S612 (i.e., excluding performance of the soft read operation of step S605 and the LLR determination operation of step S610). Consequently, the memory controller 1000 may perform step S920 iteratively without performing a time consuming soft read operation and/or LLR determination operation each time. Alternatively, the memory controller 1000 may perform one or both of steps S605 and S610, in addition to step S612, for some or all iterations of step S920 (including iterations following the initial iteration). After step S920, the memory controller 1000 proceeds to step S925.

In step S925, the memory controller 1000 performs the SFHR operation of FIG. 5 for each frame currently designated as an error frame, from among the data frames 205 and the parity frame 207. For example, the memory controller 1000 may perform step S925 to correct additional frames whose correction is made possible through the results of the page soft read operation performed in step S920. As will be discussed in greater detail below with reference to steps S930-S940, step S925 may be performed iteratively. According to at least some example embodiments, the memory controller 1000 may perform step S925 by performing only the hard decode operation portion of the SFHR operation illustrated in FIG. 5 (i.e., only step S515), without performing the hard read operation (e.g., step S510). Consequently, the memory controller 1000 may perform step S925 iteratively without performing a time consuming hard read operation each time (or, at all). Alternatively, the memory controller 1000 may perform some or all iterations of step S925 by performing both of steps S510 and S515. After step S920, the memory controller 1000 proceeds to step S930.

In step S930, the memory controller 1000 sets a value asr to the current number of error frames. The value asr represents a total number of error frames after the page soft read/correction operation of step S920. For example, in step S930, the microprocessor 111 may determine a current number of error frames of the memory page 200 by referring to frame designation data stored in the RAM 112.

In step S935, the memory controller 1000 determines whether or not the value asr is equal to 0. If, in step S935, the memory controller 1000 (e.g., the microprocessor 111) determines the value asr is equal to 0, the memory controller 1000 proceeds to step S950 and determines that the page decode operation of FIG. 9 has succeeded in decoding the memory page 200. If, in step S935, the memory controller 1000 (e.g., the microprocessor 111) determines the value asr is not equal to 0, the memory controller proceeds to step S940.

In step S940, the memory controller 1000 determines whether or not the value asr is less than the value bsr set previously in step S415. If, in step S940, the memory controller 1000 (e.g., the microprocessor 111) determines value asr is less than the value bsr, the memory controller 1000 returns to step S915. If, in step S940, the memory controller 1000 (e.g., the microprocessor 111) determines value asr is not less than the value bsr, the memory controller 1000 proceeds to step S945 and determines that the page decode operation of FIG. 9 has failed to decode the memory page 200 successfully.

Thus, according to at least one example embodiment of the inventive concepts, the memory controller 1000 performs steps S915-S940 iteratively. Each time the page soft correction operation of step S920 is performed, one or more bits of the memory page 200 may be changed. Further, the changed bits may allow for more frames to be successfully decoded in the projected ECC decoding operations of step S917 or the SFHR operations of step S925. Further, as is shown above with respect to Table 1, the stage 1-N code words used to generate the first and second projected overheads 722 and 724 may be calculated such that, as the number of error frames for which stage i delta syndrome data can be reconstructed becomes lower, an error correcting capability of the reconstructed stage i delta syndrome data becomes higher. Thus, as additional code words are corrected through iterative use of the page soft correction operation of step S920 and the SFHR operations of step S925, the error correcting capability of the stage i code words that may be used increases, and error frames with higher numbers of errors may be successfully corrected.

Thus, according to at least one example embodiment of the inventive concepts, the memory controller 1000 performs steps S915-S940 iteratively until either (i) the memory controller 1000 determines all frames of the memory page 200 have been decoded successfully or (ii) the memory controller 1000 determines that a latest iteration of performing the projected ECC decoding operation of step S917, performing the page soft read/correction operation of step S920, and performing the SFHR operations of step S925 did not result in lowering the number of error frames from among the frames of the memory page 200.

Using the encoding method of FIG. 8 and the decoding method of FIG. 9 along with the memory system 900, according to at least one example embodiment of the inventive concepts, if each cell of the page 200 of the memory cell array 2100 stores 3 bits, a total redundancy of the memory page 200 may be ~11%. For example, a length of the data bits 210 of one of the data frames 205 may be, for example, 1821 bits. Further, a length of the data bits 210 combined with the redundancy bits 215 of one of the data frames 205 may be, for example, 1964 bits. The correction capability of such a 1964 bit data frame may be, for example, 13 errors. Accordingly, a BCH redundancy rate of one of the data frames 205 may be 7.85%. Further, the page 200 may include, for example, 36 total data frames 205 and 0.5 frames for use as the parity frame 207 (i.e., the parity frame 207 is half the size of one of the data frames 205). Accordingly, the parity redundancy rate of the memory page 200 may be, for example, 1.39%. Further, the projected BCH redundancy may be 465 bits per 4 KB RAU x 2. Accordingly, a redundancy rate of the projected BCH redundancy may be, for example, 1.72% and the total redundancy rate of the memory page 200 may be, for example, 10.9%.

When BCH codes are used by the decoder 1200 and encoder 1100 of the memory system 900 to implement the encoding method of FIG. 8 and the decoding method of FIG. 9, HW complexity (e.g., the HW complexity of the memory controller 1000) may be very small in comparison to the HW complexity of a memory controller that uses LDPC codes for encoding and decoding since the basic BCH code word length (e.g., ~2000) and correction capability (t) (e.g., ~13 errors) may be relatively small compared to conventional BCH codes.

Further, the memory system 900 implementing the encoding method of FIG. 3 and the decoding method of FIG. 4 may achieve a BER coverage that exceeds 1K LDPC code performance, and achieves excellent throughput performance due to very low soft decision probability.

Figure 11:
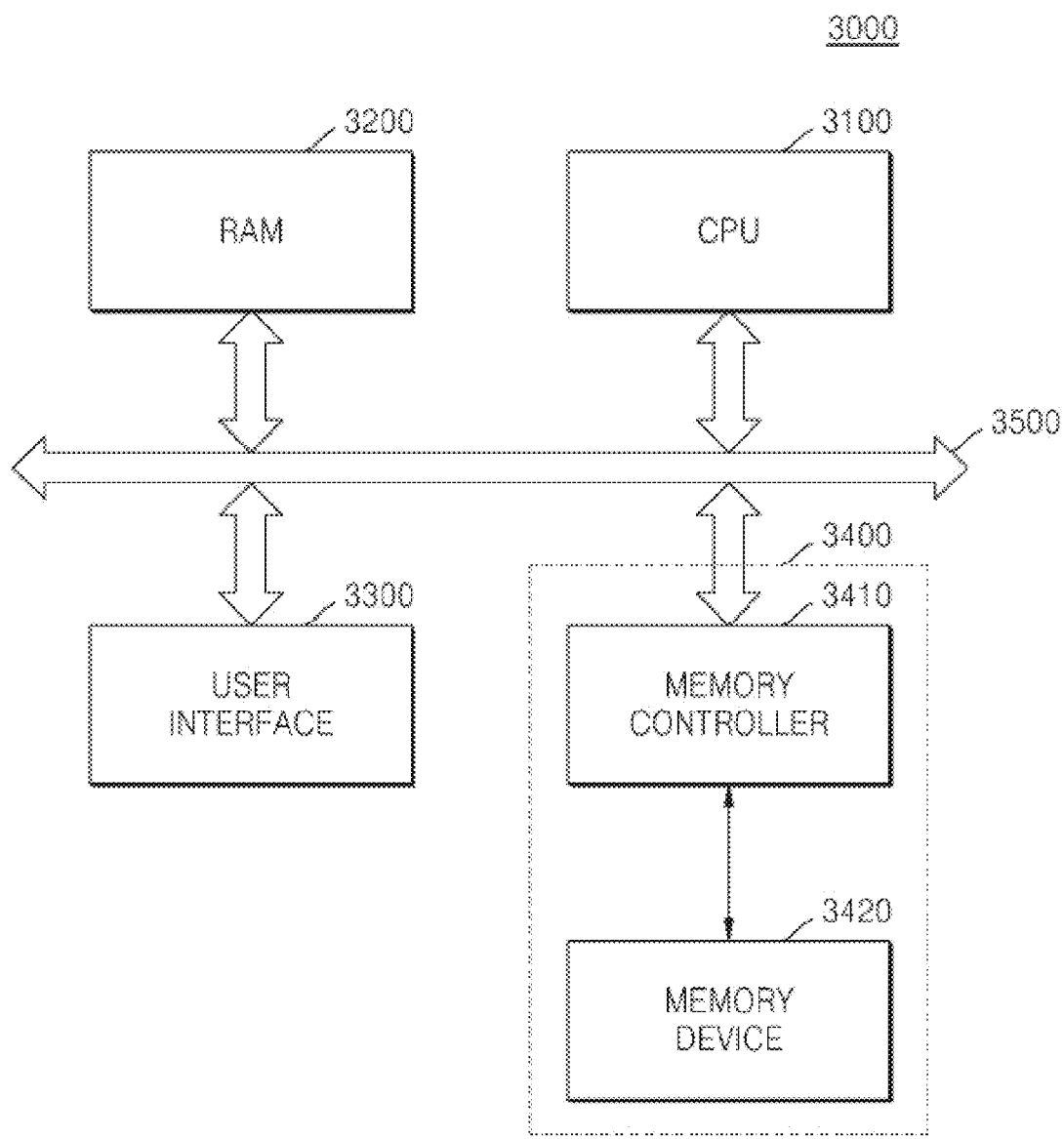
FIG. 11 is a block diagram showing a computer system including a memory system according to example embodiments of inventive concepts.

FIG. 11 is a block diagram showing a computer system 3000 including a memory system according to at least one example embodiment of the inventive concepts. The computer system 3000, such as a mobile device, a desktop computer, and a server, may employ a memory system 3400 according to at least one example embodiment of the inventive concepts.

The computer system 3000 may include a central processing unit 3100, a RAM 3200, a user interface 3300, and the memory system 3400, are electrically connected to buses 3500. The host as described above may include the central processing unit 3100, the RAM 3200, and the user interface 3300 in the computer system 3000. The central processing unit 3100 may control the entire computer system 3000 and may perform calculations corresponding to user commands input via the user interface 3300. The RAM 3200 may function as a data memory for the central processing unit 3100, and the central processing unit 3100 may write/read data to/from the memory system 3400.

As in example embodiments of inventive concepts described above, the memory system 3400 may include a memory controller 3410 and a memory device 3420. The memory controller 3410 may include an encoder, a decoder, and a stuck cell information storing unit, the memory device 3420 may include a cell array including a plurality of memory cells, and the cell array may include stuck cells. The encoder may receive information regarding stuck cells from the stuck cell information storing unit, encode data to be stored in the cell array, generate code word, and generate a header corresponding to the code word. The code word generated by the encoder may include values of the stuck cells included in the cell array. The decoder may extract encoding information from the header and decode the data stored in the cell array based on the encoding information.

According to at least one example embodiment of the inventive concepts, the memory controller 3410 and a memory device 3420 may be implemented, respectively, by the memory controller 1000 and a memory device 2000 discussed above with reference to FIGS. 1-10.

Figure 12:
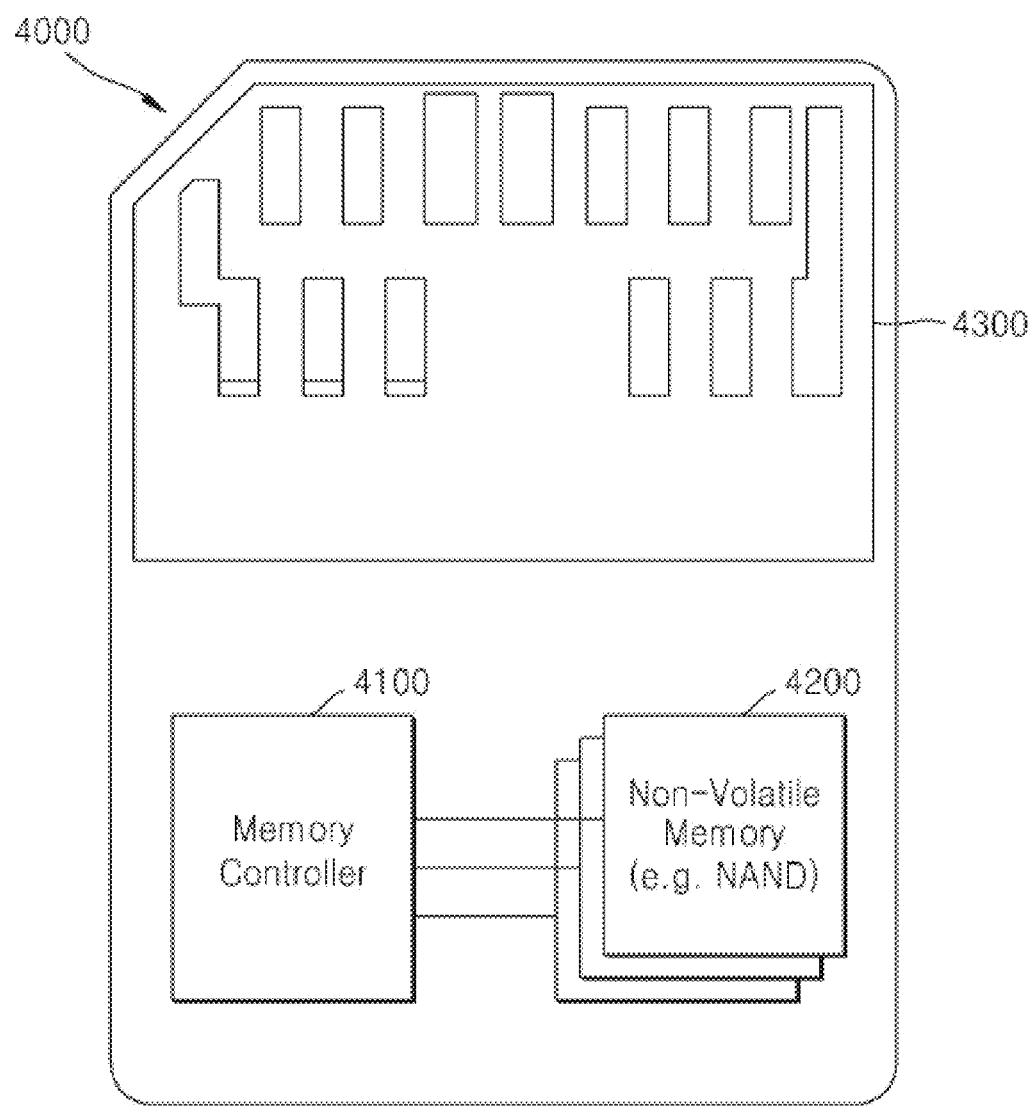
FIG. 12 is a block diagram showing a memory card according to at least one example embodiment of the inventive concepts.

FIG. 12 is a block diagram showing a memory card 4000 according to at least one example embodiment of the inventive concepts. A memory system 900 according to example embodiments of inventive concepts discussed above with reference to FIGS. 1-10 may be the memory card 4000. For example, the memory card 4000 may include an embedded multimedia card (eMMC) or a secure digital (SD) card. As shown in FIG. 12, the memory card 4000 may include a memory controller 4100, a non-volatile memory 4200, and a port region 4300. A memory device 2000 according to example embodiments of inventive concepts discussed above with reference to FIGS. 1-10 may be the non-volatile memory 4200 shown in FIG. 12.

The memory controller 4100 may include an encoder, a decoder, and a stuck cell information storing unit according to example embodiments of inventive concepts as described above. The encoder and the decoder may perform an encoding method and a decoding method according to example embodiments of inventive concepts, whereas the stuck cell information storing unit may store information regarding stuck cells included in the non-volatile memory 4200. The memory controller 4100 may communicate with an external host via the port region 4300 in compliance with a pre-set protocol. The protocol may be eMMC protocol, SD protocol, SATA protocol, SAS protocol, or USB protocol. The non-volatile memory 4200 may include memory cells which retain data stored therein even if power supplied thereto is blocked. For example, the non-volatile memory 4200 may include a flash memory, a magnetic random access memory (MRAM), a resistance RAM (RRAM), a ferroelectric RAM (FRAM), or a phase change memory (PCM).

According to at least one example embodiment of the inventive concepts, the memory controller 4100 and a memory device 4200 may be implemented, respectively, by the memory controller 1000 and a memory device 2000 discussed above with reference to FIGS. 1-10.

Figure 13:
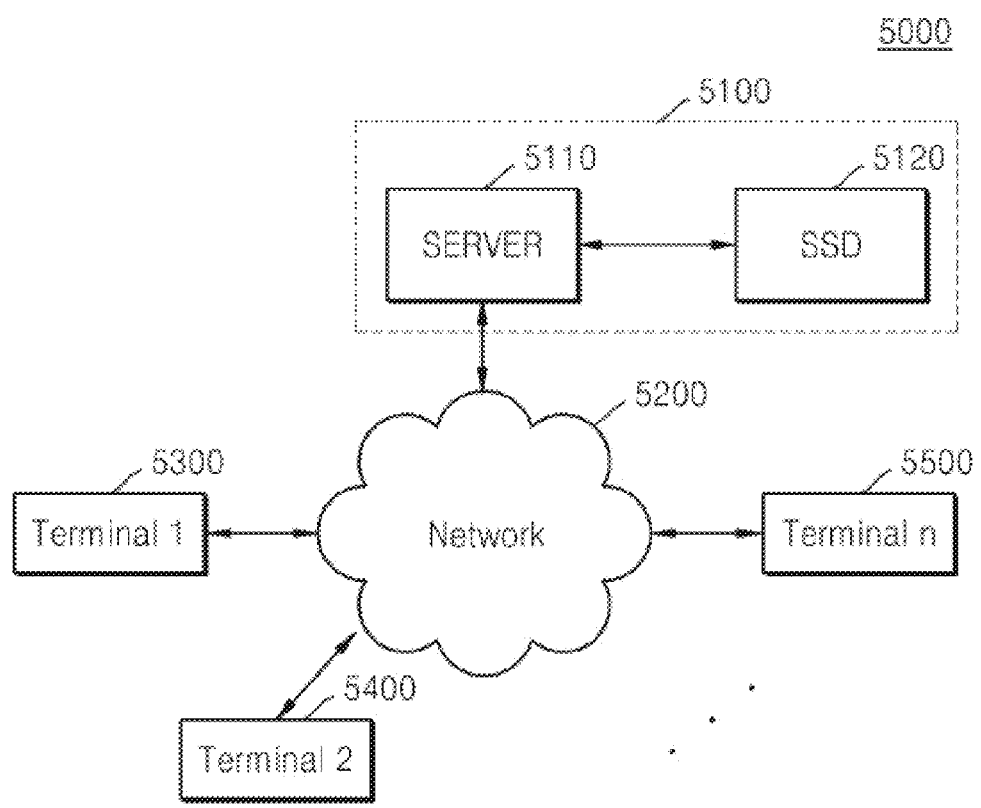
FIG. 13 is a block diagram showing an example network system including a memory system according to at least one example embodiment of the inventive concepts.

FIG. 13 is a block diagram showing an example network system 5000 including a memory system according to at least one example embodiment of the inventive concepts. As shown in FIG. 13, the network system 5000 may include a server system 5100 and a plurality of terminals 5300, 5400, and 5500 that are connected via a network 5200. The server system 5100 may include a server 5110 for processing requests received from the plurality of terminals 5300, 5400, and 5500 connected to the network 5200 and a SSD 5120 for storing data corresponding to the requests received from the terminals 5300, 5400, and 5500. Here, the SSD 5120 may be a memory system according to at least one example embodiment of the inventive concepts.

According to at least one example embodiment of the inventive concepts, SSD 5120 may be implemented by the memory system 900 discussed above with reference to FIGS. 1-10.

Meanwhile, a memory system according to example embodiments of inventive concepts may be mounted via any of various packages. For example, a memory system according to at least one example embodiment of the inventive concepts may be mounted via any of packages including package on package (PoP), ball grid arrays (BGAs), chip scale packages (CSPs), plastic leaded chip Carrier (PLCC), plastic dual in-line package (PDIP), die in waffle pack, die in wafer form, chip on board (COB), ceramic dual in-line package (CERDIP), plastic metricquad flat pack (MQFP), thin quad flatpack (TQFP), small outline (SOIC), shrink small outline package (SSOP), thin small outline (TSOP), thin quad flatpack (TQFP), system in package (SIP), multi chip package (MCP), wafer-level fabricated package (WFP), wafer-level processed stack package (WSP), etc.

It should be understood that example embodiments described herein should be considered in a descriptive sense only and not for purposes of limitation. Descriptions of features or aspects within each embodiment should typically be considered as available for other similar features or aspects in other example embodiments.

What is claimed is:

1. A memory system comprising:
a memory controller; and
a memory device,
the memory device including a memory cell array,
the memory cell array including least a first memory page having a plurality of memory cells storing a plurality of stored bits,
the memory controller being configured such that,
the memory controller performs a first hard read operation on the first memory page to generate a plurality of read bits corresponding to the plurality of stored bits,
the memory controller generates an operation value,
the memory controller determines, based on the operation value, whether or not to change a value of one of a first group of bits, the first group of bits being bits from among the plurality of read bits, and
if the memory controller determines to change a value of one of the first group of bits, the memory controller selects one of the first group of bits based on log likelihood ratio (LLR) values corresponding, respectively, to each of the first group of bits, and changes the value of the selected bit.

2. The memory system of claim 1, wherein the memory controller is further configured such that,
the memory controller performs a first Bose-Chaudhuri-Hocquenghem (BCH) error correcting code (ECC) decoding operation to correct errors among the plurality of read bits generated by the first hard read operation, and
when the memory controller determines to change one of the first group of bits,
the memory controller performs a second BCH ECC decoding operation on the plurality of read bits, including the selected bit the value of which was changed, to correct additional errors among the plurality of read bits.

3. The memory system of claim 2 wherein the first memory page is configured such that,
the plurality of stored bits are arranged in a plurality of rows and a plurality of columns, the plurality of rows including a plurality of data frames and at least one parity frame,
the at least one parity frame includes a plurality of parity values corresponding, respectively, to a plurality of column groups, each of the plurality of column groups including at least one of the plurality of columns of the first memory page, and
each one of the plurality of parity values is the result of an XOR operation performed on each of the bits, from among the stored bits, that are included in one of the data frames and included in the column group to which the parity value corresponds.

4. The memory system of claim 3, wherein the memory controller is configured to designate each of the plurality of data frames as being one of one or more error frames or one of or more correct frames, based on the results of at least one of the first and second BCH ECC decoding operations.

5. The memory system of claim 4, wherein the memory controller is configured such that,
the first group of bits are bits, from among the read bits, that correspond to a first group of stored bits,
the first group of stored bits are bits, from among the plurality of stored bits, that are included in a first column group from among the plurality of column groups,
each bit of the first group of stored bits is included in a data frame from among the one or more error frames, and
the memory controller obtains, as the operation value, a value generated based on a result of performing an XOR operation on,
the parity value, from among the plurality of parity values, that corresponds to the first column group, and first correct bits, the first correct bits being bits that are included in the first column group and are not included in a data frame from among the one or more error frames.

6. The memory system of claim 5, wherein the memory controller is configured such that,
the memory controller generates a comparison result based on the operation value and a result of an XOR operation performed on the first group of bits, and
the memory controller determines whether or not to change the value of one of the first group of bits based on the comparison result.

7. A memory system comprising:
a memory controller; and
a memory device, the memory device including a memory cell array,
the memory cell array including least a first memory page having a plurality of memory cells,
the memory controller being configured to,
receive a plurality of bits from an external device,
generate a plurality of first data code words by performing error correcting code (ECC) encoding on the received plurality bits, each of the plurality of first data code words including first data bits and first redundancy bits, the first redundancy bits providing an initial error correction capability with respect to the first data bits,
store the plurality of first data code words, respectively, as a plurality of data frames in the first memory page, and
generate delta syndrome data, the generated delta syndrome data including at least a plurality of first stage delta syndromes corresponding to the plurality of first data code words, respectively, such that,
for each first data code word, of the plurality of first data code words, the first stage delta syndrome that corresponds to the first data code word provides a first stage error correction capability, the first stage error correction capability being an additional error correction capability with respect to the initial error correction capability provided by the first redundancy bits of the first data code word.

8. The memory system of claim 7, wherein the memory controller is configured to generate the plurality of first data code words by performing Bose-Chaudhuri-Hocquenghem (BCH) ECC encoding such that the plurality of first data code words are BCH code words.

9. The memory system of claim 7, wherein the memory controller is configured such that,
the generated delta syndrome data generated by the memory controller includes, for each of the plurality of first data code words, N stages of delta syndromes, N being a positive integer,
delta syndromes of different stages among the N stages of delta syndromes having different additional error correction capabilities with respect to the initial error correction capability provided by the first redundancy bits of the first data code words to which the delta syndromes of different stages among the N stages of delta syndromes correspond,
delta syndromes of the same stage among the N stages of delta syndromes having the same additional error correction capabilities with respect to the initial error correction capability provided by the first redundancy bits of the first data code words to which the delta syndromes of same stage among the N stages of delta syndromes correspond.

10. The memory system of claim 9 wherein,
the memory controller is configured to generate N stages of second code words corresponding, respectively, to the N stages of delta syndromes such that,
the second code words are Reed-Solomon (RS) code words each including second redundancy bits,
a stage i second code word, among the N stages of second code words, is generated by performing RS encoding on stage i delta syndromes, among the N stages of delta syndromes, and
a total number of the second redundancy bits included in a second code word, from among the N stages of second code words, is inversely related to a total number of bits the additional error correction capability of one of the delta syndromes encoded by the second code word is capable of correcting.

11. The memory system of claim 10 wherein,
the memory controller is configured to generate a projected overhead protection code word by performing an ECC encoding operation on the second redundancy bits of each of the N stages of second code words, and
the memory controller is configured to store the projected overhead protection code word in the memory device.

12. The memory system of claim 9, wherein the memory controller is configured such that,
bits of the plurality of first data code words include a plurality of rows and a plurality of columns, the plurality of rows corresponding to the plurality of data frames,
the memory controller generates at least one parity frame such that,
the at least one parity frame includes a plurality of parity values corresponding, respectively, to a plurality of column groups, each of the plurality of column groups including at least one of the plurality of columns, and
each one of the plurality of parity values is the result of an XOR operation performed by the memory controller on bits, from among the bits of the plurality of first data code words, that are included in one of the data frames and included in the column group to which the parity value corresponds, and
the memory controller stores the at least one parity frame in the first memory page.

13. A memory system comprising:
a memory controller; and
a memory device,
the memory device including a memory cell array, the memory cell array including least a first memory page having a plurality of memory cells storing a plurality of stored bits;
the memory controller is configured to perform a first hard read operation on the first memory page to generate a plurality of first data code words corresponding to the plurality of stored bits, the plurality of first data code words each including first data bits and first redundancy bits, the first redundancy bits providing an initial error correction capability,
the memory controller is configured to perform a first error correcting code (ECC) decoding operation to correct errors among the first data code words using the initial error correction capabilities of the first redundancy bits of the first data code words, the memory controller is configured to determine whether or not to augment initial correction capabilities of one or more error code words, each of the one or more error code words being a first data code word, from among the plurality of first data code words, having a number of bits errors that exceeds an initial correction capability of the first redundancy bits of the first data code word, and the memory controller is configured such that, if the memory controller determines to augment the initial correction capabilities of one or more error code words, the memory controller generates one or more first delta syndromes corresponding, respectively, to the one or more error code words, each of the one or more first delta syndromes having a first additional error correction capability, and the memory controller augments the initial correction capabilities of the one or more error code words by performing a second error correcting code (ECC) decoding operation to correct errors among the one or more error code words using the initial error correction capabilities of the first redundancy bits of the one or more error code words augmented by the first additional error correction capabilities of the one or more first delta syndromes.

14. The memory system of claim 13 wherein, the plurality of first data code words are Bose-Chaudhuri-Hocquenghem (BCH) code words, and the first and second ECC decoding operations are BCH decoding operations.

15. The memory system of claim 13 wherein, the memory controller is configured to obtain, based on overhead protection data stored in the memory device, second redundancy bits of at least one second code word, the at least one second code word being a code word generated by performing Reed-Solomon (RS) encoding on a plurality of first delta syndromes, the memory controller is configured to determine a total number of the one or more error code words based on the first ECC decoding operation, and the memory controller is configured to determine whether or not to augment the initial correction capabilities of the one or more error code words by, deciding to augment the initial correction capabilities of the one or more error code words if a maximum number of delta syndromes, from among the plurality of first delta syndromes, that can be reconstructed by the memory controller using the second redundancy bits is not less than a total number of the one or more error code words, and deciding not to augment the initial correction capabilities of the one or more error code words if a maximum number of delta syndromes, from among the plurality of first delta syndromes, that can be reconstructed by the memory controller using the second redundancy bits is less than a total number of the one or more error code words.

16. The memory system of claim 15, wherein the memory controller is configured such that, when the memory controller decides to augment the initial correction capabilities of the one or more error code words, the memory controller calculates first delta syndromes based on data bits of correct first code words, each of the correct first code words being a first data code word, from among the plurality of first data code words, that is not one of the one or more error code words, and the memory controller obtains the one or more first delta syndromes of the one or more error frames by performing an RS decoding operation to reconstruct the one or more first delta syndromes of the one or more error frames, the RS decoding operation being performed using the calculated first delta syndromes and the second redundancy bits.

17. The memory system of claim 15 wherein the memory controller is configured to obtain the second redundancy bits of at least one second code word by performing a BCH decoding operation on the overhead protection data stored in the memory device.

* * * * *